United States Patent
Gong et al.

(10) Patent No.: US 11,519,753 B2
(45) Date of Patent: Dec. 6, 2022

(54) INDUCTIVE SENSING APPARATUS AND METHOD

(71) Applicant: Trustees of Dartmouth College, Hanover, NH (US)

(72) Inventors: Jun Gong, West Lebanon, NH (US); Xing-Dong Yang, Hanover, NH (US)

(73) Assignee: Trustees of Dartmouth College, Hanover, NH (US)

( * ) Notice: Subject to any disclaimer, the term of this patent is extended or adjusted under 35 U.S.C. 154(b) by 371 days.

(21) Appl. No.: 16/596,346

(22) Filed: Oct. 8, 2019

(65) Prior Publication Data
US 2020/0109967 A1 Apr. 9, 2020

Related U.S. Application Data

(60) Provisional application No. 62/743,270, filed on Oct. 9, 2018.

(51) Int. Cl.
*G01B 7/14* (2006.01)
*G01D 5/22* (2006.01)
(Continued)

(52) U.S. Cl.
CPC ....... *G01D 5/2291* (2013.01); *G01R 27/2611* (2013.01); *H02J 50/12* (2016.02)

(58) Field of Classification Search
CPC .... G01R 27/2611; G01R 31/42; G01D 5/202; G01D 5/2291; G01V 3/101; G01V 3/104
See application file for complete search history.

(56) References Cited

U.S. PATENT DOCUMENTS

| | | | |
|---|---|---|---|
| 2005/0110359 A1* | 5/2005 | Felsenstein | G01D 5/2525 310/184 |
| 2013/0257417 A1* | 10/2013 | Ely | G01D 5/2013 324/207.22 |

(Continued)

OTHER PUBLICATIONS

International Search Report and Written Opinion dated Jan. 9, 2020 in PCT/US19/55355, 15 pages
(Continued)

*Primary Examiner* — Thang X Le
(74) *Attorney, Agent, or Firm* — Oblon, McClelland, Maier & Neustadt, L.L.P.

(57) ABSTRACT

Aspects of the disclosure provide a sensing apparatus including a sensing device, a memory, and processing circuitry. The sensing device includes resonators having respective resonant frequencies. The resonators include an array of inductive coils positioned on a surface of the apparatus. The sensing device can output a signal indicating changes of the resonant frequencies caused by presence of an object proximate to the surface. The memory stores reference signals corresponding to reference objects. Each reference signal indicates changes of the resonant frequencies caused by the respective reference object proximate to the surface. The processing circuitry can receive, from the sensing device, a particular signal indicating changes of the resonant frequencies caused by presence of a particular object proximate to the surface. The processing circuitry compares the particular signal with the stored reference signals of the reference objects to determine an identity of the particular object.

20 Claims, 21 Drawing Sheets

(51) Int. Cl.
　　　G01R 27/26　　　(2006.01)
　　　H02J 50/12　　　(2016.01)

(56) References Cited

U.S. PATENT DOCUMENTS

| 2014/0247041 | A1* | 9/2014 | Rodiac | G01B 7/023 |
| | | | | 324/207.18 |
| 2017/0307891 | A1* | 10/2017 | Bucknor | G02B 27/017 |
| 2017/0328740 | A1* | 11/2017 | Widmer | B60L 50/66 |
| 2018/0054091 | A1* | 2/2018 | Liu | H02J 50/005 |
| 2019/0326782 | A1* | 10/2019 | Graham | H01F 27/28 |
| 2020/0076246 | A1* | 3/2020 | Fukuzawa | G01V 3/101 |
| 2020/0328616 | A1* | 10/2020 | Van Wageningen | H02J 50/12 |

OTHER PUBLICATIONS

Aria Wearable, Retrieved Mar. 15, 2018 from http://www.ariawearables.com/, 9 pages.
Samsung Gear Smartwatches, Retrieved Mar. 11, 2018 froms https://www.samsung.com/us/mobile/wearables/, 2018, 10 pages.
TI LDC Sensor Design Application Report SNOA930, Retrieved Mar. 15, 2018 from http://www.ti.com/lit/an/snoa930b/snoa90b.pdf, 2015, 29 pages.
Ashbrook, D., et al.,"An investigation into round touchscreen wristwatch interaction", In Proceedings of the 10th International Conference on Human Computer Interaction with Mobile Devices and Services (MobileHCI'08), 2008, pp. 311-314.
Bao L., et al., "Activity recognition from user-annotated acceleration data", In International Conference on Pervasive Computing (Pervasive'04), Springer, 2004, pp. 1-17.
Berlin, E., et al., "Coming to grips with the objects we grasp: detecting interactions with efficient wrist-worn sensors", In Proceedings of the fourth international conference on Tangible, embedded, and embodied interaction (TEI'10), 2010, pp. 57-64.
Buettner, M., et al., "Recognizing daily activities with RFID-bssed sensors", In Proceedings of the 11th international conference on Ubiquitous computing (UbiComp'09), 2009, pp. 51-60.
Chen, X., et al., "Duet: exploring joint interactions on a smart phone and a smart watch", In Proceedings of the SIGCHI Conference on Human Factors in Computing Systems (CHI'14), 2014, pp. 159-168.
Cheng. K. -Y., et al., "iCon: utilizing everyday objects as additional, auxiliary and instant tabletop controllers", In Proceedings of the SIGCHI Conference on Human Factors in Computing Systems (CHI'10), 2010, pp. 1155-1164.
Dementyev, A., et al., "WristFlex: low-power gesture input with wrist-wom pressure sensors", In Proceedings of the 27th annual ACM symposium on User interface software and technology (UIST'14), 2014, pp. 161-166.
Fukui, R., et al., "Hand shape classification with a wrist contour sensor: Development of a prototype devce", In Proceedings of the 13th international conference on Ubiquitous computing (UbiComp'11), 2011, pp. 311-314.
Gong, J., et al., "WristWhirl: One-handed Continuous Smartwatch Input using Wrist Gestures", In Proceedings of the 29th Annual Symposium on User Interface Software and Technology (UIST '16), 2016, pp. 861-872.
Grosse-Puppenoahl, T., et al., "Capacitive near-field communication for ubiquitous interaction and perception", In Proceedings of the 2014 ACM International Joint Conference on Pervasive and Ubiquitous Computing (UbiComp'14), 2014, pp. 231-242.
Hachè, G., et al., "Wearable mobility monitoring using a multimedia smartphone platform", In IEEE transactions on instrumentation and measurement, vol. 60, No. 9, Sep. 2011, pp. 3153-3161.
Harrison, C., et al., "Abracadabra: wireless, high-precsion, and unpowered finger input for very smail mobile devices", In Proceedings of the 22nd annual ACM symposium on User interface software and technology (UIST '09), 2009, pp. 121-124.

Harrison, C., et al., "Skinput: approaching the body as an input surface", In Proceedings of the SIGCHI Conference on Human Factors in Computing Systems (CHI '10), 2010 pp. 453-462.
Hodges, S., et al., "Assessing and optimizing the range of UHF RFID to enable real-world pervasive computing applications", In International Conference on Pervasive Computing (Pervasive'07) 2007, pp. 280-297.
Kim, J., et al., The Gesture Watch: A Wireless Contact-free Gesture based Wrist Interface. In Proceedings of the 2007 11th IEEE International Symposium on Wearable Computers (ISWC'07), 2007, pp. 1-8.
Laput, G., et al., "Skin buttons: cheap, small, low-powered and clickable fixed-icon laser projectors", In Proceedings of the 27th annual ACM symposium on User interface software and technology (UIST'14), 2014, pp. 389-394.
Laput, G., et al., "ViBand: High-fidelity bio-acoustic sensing using commodity smartwatch accelerometers", In Proceedings of the 29th Annual Symposium on User Interface Software and Technoiogy (UIST'16), 2016, pp. 321-333.
Laput, G., et al., "Em-sense: Touch recognition of uninstrumented, electrical and electromechanical objects", In Proceedings of the 28th Annual ACM Symposium on User Interface Software and Technology (UIST'15), 2015, pp. 157-166.
Li, H., et al., "PaperID: A Technique for Drawing Functional Battery-Free Wireless Interfaces on Paper", In Proceedings of the 2016 CHI Conference on Hunan Factots in Computing Systems (CHI'16), 2016, pp. 6865-5896.
Li, H., et al., "IDSense: A Human Object Interaction Detection System Based on Passive UHF RFID", In Proceedings of the 33rd Annual ACM Conference on Human Factors in Computing Systems (CHI'15), 2015, pp. 2555-2564.
Lien, J., et al., "Soli: Ubiquitous Gesture Sensing with Millimeter Wave Radar", In ACM Transactions on Graphics (SIGGRAPH'16), 2016, pp. 142:1-142:19.
Maekawa, T., et al., "Recognizing handheld electrical device usage with hand-worn coil of wire", In International Conference on Pervasive Computing (Pervasive'12), 2012, pp. 234-252.
McIntosh, J., et al., "SensIR: Detecting Hand Gestures with a Wearable Bracelet using Infrared Transmission and Reflection" In Proceedings of the 30th Annual ACM Symposium on User Interface Software and Technology (UIST'17), 2017, pp. 593-597.
Misron, N., et al., "Effect of inductive coil shape on sensing performance of linear displacement sensor using thin inductive coil and pattern guide", Sensors, vol. 11 (11), 2011, pp. 10522-10533.
Mohan, S.S., et al., "Simple accurate expressions for planar spiral inductances", IEEE Journal of solid-state circuits, vol. 34 No. 10, 1999, pp. 1419-1424.
Oakley, I., et al., "Interaction on the Edge: offset sensing for small devices", In Proceedings of the SIGCHI Conference on Human Factors in Computing Systems (CHI'14), 2014, 169-178.
Van Oosterhout, A., et al., "Ripple Thermostat: Affecting the Emotional Experience through Interactive Force Feedback and Shape Change", In Proceedings of the SIGCHI Conference on Human Factors in Computing Systems (CHI'14), 2018, pp. 1-12.
Ortega-Avila, S., et al., "Non-invasive optical detection of hand gestures", In Proceeding of the 6th Augmented Human International Conference (AH'15), 2015, pp. 179-180.
Pasquero, J., et al., "A haptic wristwatch for eyes-free interactions", In Proceedings of the SIGCHI Conference on Human Factors in Computing Systems (CHI'11), 2011, pp. 3257-3266.
Peltonen, V., et al., "Computational auditory scene recognition", In IEEE International Conference on Acoustics, Speech, and Signal Processing (ICASSP'02), 2002, pp. II-1941-II-1944.
Perrault, S.T., et al., "Watchit: simple gestures and eyes-free interaction for wristwatches and bracelets", In Proceedings of the SIGCHI Conference on Human Factors in Computing Systems (CHI'13), 2013, pp. 1451-1460.
Ranjan, J., et al., "Using mid-range RFID for location based activity recognition", In Proceedings of the 2012 ACM Conference on Ubiquitous Computing (UbiComp'12), 2012, pp. 64-648.

(56) References Cited

OTHER PUBLICATIONS

Rekimoto, J., "GestureWrist and GesturePad: Unobtrusive Wearable Interaction Devices", In Proceedings of the 5th IEEE International Symposium on Waarable Computers (ISWC'01), 2001, pp. 21-27.
Ren, X., et al., "Egocentric recognition of handled objects: Benchmark and analysis", In Computer Vision and Pattern Recognition Workshops, 2009, pp. 1-8.
Rosa, E.B., "The self and mutual inductances of linear conductors", Bulletin of the Bureau of Standards, vol. 4, 1908, pp. 301-344.
Saponas, T.S., et al., "Enabling always-available input with muscle-computer interfaces", In Proceedings of ths 22nd annual ACM symposium on User interface software and technology (UIST '09), 2009, pp. 167-176.
Sato, M., et al., "Touché: Enhancing Touch interaction on Humans, Screens, Liquids, and Everyday Objects", In Proceedings of the SIGCHI Conference on Human Factors in Computing Systems (CHI '12), 2012, pp. 483-492.
Seyed, T., et al., "Doppio: A Reconfigurable Dual-Face Smartwatch for Tangible Interaction", In Proceedings of the 2018 CHI Conferenice on Human Factors in Computing Systems (CHI'16), 2016, pp. 4675-4686.
Smith, J.R., et al., "RFID-based techniques for human-activity detection", Communications of the ACM, vol. 48 No. 9, 2005, pp. 39-44.
Villar, N., et al., "Project Zanzibar: A Portable and Flexible Tangible Interaction Platform", In Proceedings of the 2018 CHI Conference on Human Factors in Computing Systems, 2018, 13 pages.
Wang. E.J., et al., "Magnitisense: Interring device interaction using wrist-worn passive magneto-inductive sensors", In Proceedings of the 2015 ACM International Joint Conference on Pervasive and Ubiquitous Computing (UbiComp'15), 2015, pp. 15-26.
Ward, J.A., et al., "Activity recognition of assembly tasks using body-worn microphones and accelerometers", IEEE transactions on pattern analysis and machine intelligence, vol. 28 No. 19, 2006, pp. 1553-1567.
Xiao, R., et al., "LumiWatch: On-Arm Projected Graphics and Touch Input"; In Proceedings of the 2018 CHI Conference on Human Factors in Computing Systems (CHI '18), 2018, 11 pages.
Xiao, R., et al., "Expanding the input expressivity of smartwatches with mechanical pan, twist, tilt and click", In Proceedings of the SIGCHI Conference on Human Factors to Computing Systems (CHI'14), 2014, pp. 193-196.
Xiao, R., et al., "Deus EM Machina: on-touch contextual functionality for smart IoT appliances", In Proceedings of the 2017 CHI Conference on Human Factors in Computing Systems (CHI'17 ), 2017, pp. 4000-4008.
Yang, R., et al. "Learning from a learning thermostat: lessons for inelligent systems for the home", In Proceedings of the 2013 ACM international joint conference on Pervasive and ubiquitous computing (UbiComp'13), 2013, pp. 93-102.
Yeo, H.-S., et al., "Radarcat: Radar categorization for input and interaction", In Proceedings of the 29th Annual Symposium on User Interface Software and Technology (UIST'16), 833-841.
Zhang, Y., et al., "Tomo: Wearable, Low-Cost Electrical Impedance Tomography for Hand Gesture Recognition", In Proceedings of the 28th Annual ACM Symposium on User Interface Software and Technology (UIST'15), 2015, pp. 167-173.
Zhang. Y., et al., "Advancing hand gesture recognition with high resolution electrical impedance tomography", In Proceedings of the 29th Annual Symposium on User Interface Software and Technology (UIST'16), 2016, pp. 843-850.
Zhang, Y., et al., "SkinTrack: Using the Body as an Electrical Waveguide for Continuaus Finger Tracking on the Skin", In Proceedings of the 2016 CHI Conference on Human Factors in Computing Systems (CHI'16), 2016, pp. 1491-1503.
Zhao, J., "A new calculation for designing muitilayer planar spiral inductors", EDN (Electrical Design News), vol. 55 No. 14, 2010, pp. 37-40.
Zhou, J., et al., "AuraSense: enabling expressive around-smartwatch interactions with electric field sensing", In Proceedings of the 29th Annual Symposium on User Interface Software and Technology (UIST'16), 2016, pp. 81-86.

* cited by examiner

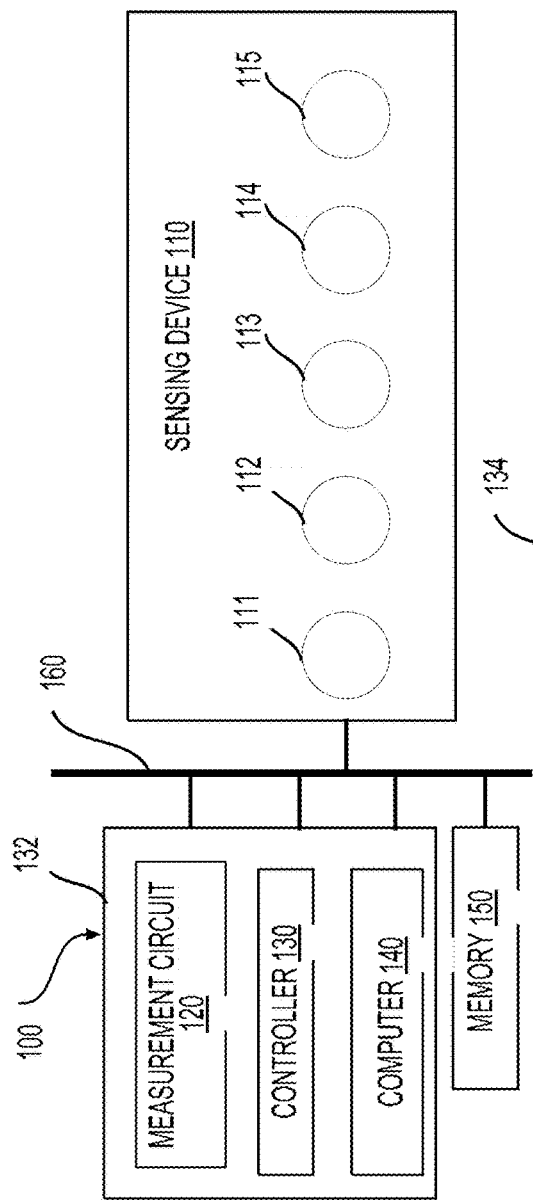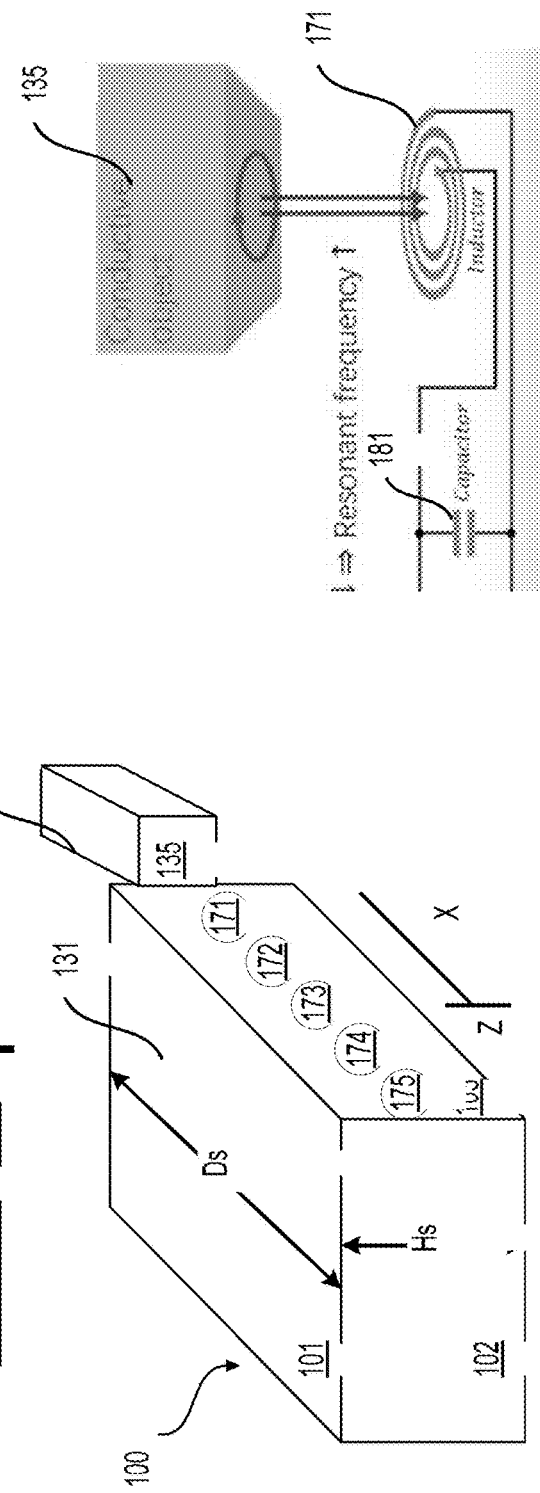

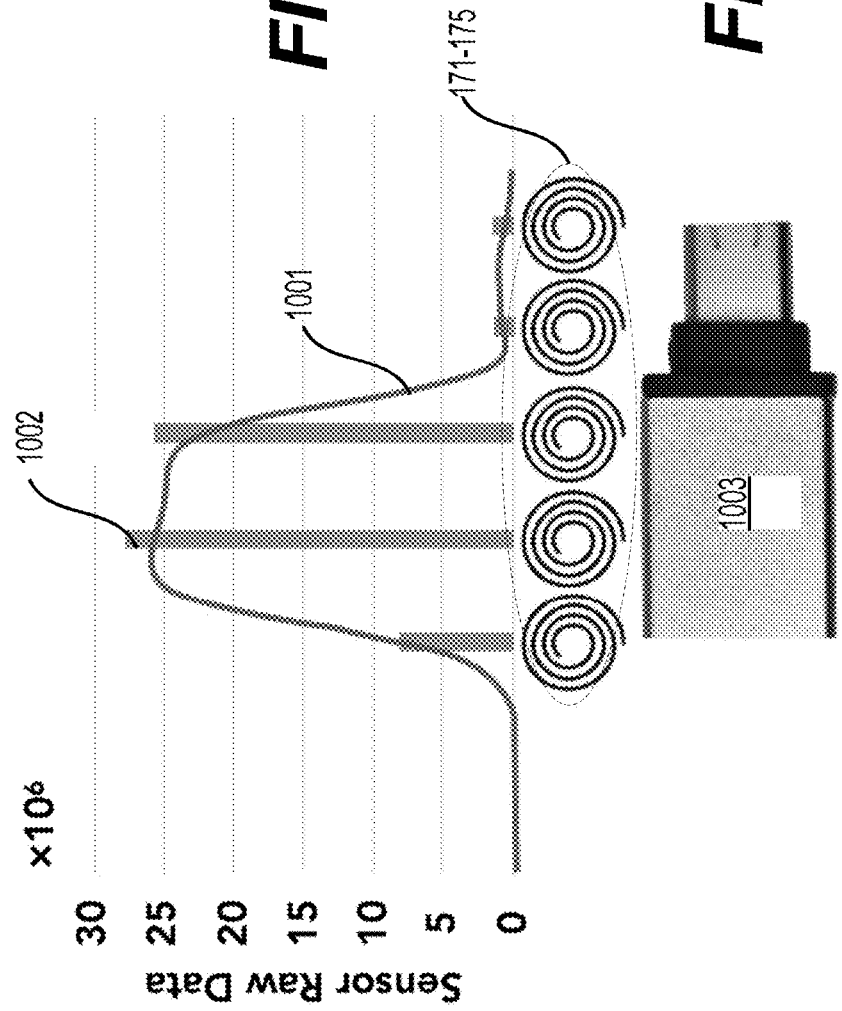

INDUCTIVE SENSING APPARATUS AND METHOD

INCORPORATION BY REFERENCE

This present disclosure claims the benefit of priority to U.S. Provisional Application No. 62/743,270, "Inductive Sensors Including Arrays of Inductive Coils and Methods of Using the Same" filed on Oct. 9, 2018, which is incorporated by reference herein in its entirety.

STATEMENT OF ACKNOWLEDGEMENT

This invention was made with Government support under 1565269 awarded by National Science Foundation. The Government has certain rights in the invention.

TECHNICAL FIELD

The present disclosure describes embodiments generally related to inductive sensing technology.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Wearable devices have built-in sensors, such as accelerometers, to detect the motion of the device to infer user activities. Many options allow object recognition on such devices. On the other hand, input on wearable devices can be achieved by touching a screen that can be relatively small.

SUMMARY

Aspects of the disclosure provide a sensing apparatus including a sensing device, a memory, and processing circuitry. The sensing device can include resonators having respective resonant frequencies. The resonators can include an array of inductive coils positioned on a surface of the apparatus. The sensing device is configured to output a signal indicating changes of the resonant frequencies of the inductive coils caused by presence of an object proximate to the surface of the apparatus. The memory can store, for each reference object of a plurality of reference objects, a reference signal corresponding to the reference object where the reference signal indicates changes of the resonant frequencies of the inductive coils caused by presence of the reference object proximate to the surface of the apparatus. The processing circuitry is configured to receive, from the sensing device, a particular signal caused by presence of a particular object proximate to the surface of the apparatus where the particular signal indicates changes of the resonant frequencies of the inductive coils caused by the presence of the particular object. The processing circuitry can compare the particular signal with the stored reference signals of the reference objects to determine an identity of the particular object.

In an embodiment, the surface of the sensing apparatus is a substantially planar surface and the particular object is in contact with the surface when the particular signal is received by the processing circuitry. In an example, the array of inductive coils is a linear array in which the inductive coils are arranged in a straight line. A number of the inductive coils in the array of inductive coils can be five. In an example, each inductive coil in the array of inductive coils is a circular coil that has multiple layers and multiple turns. The processing circuitry can further configured to determine, based on the received particular signal, a length of the particular object that is contact with the surface.

In an embodiment, each inductive coil of the array of inductive coils is a planar spiral coil having a circular shape.

The processing circuitry can be further configured to compare the particular signal with each of the reference signals of the reference objects using k-nearest neighbors algorithm.

In an embodiment, the surface of the sensing apparatus is a substantially planar surface and the particular object is in contact with the surface when the particular signal is received by the processing circuitry. The reference signals of the reference objects include a plurality of signals for each of the reference objects. After the particular object is identified, the processing circuitry is further configured to receive sliding signals when the particular object is sliding along an axis in the planar surface and determine linear positions based on the plurality of signals and the received sliding signals. The sliding signals correspond to the linear positions of the particular object along the axis. In an example, each of the sliding signals corresponds to a respective one of the linear positions. For each sliding signal of the sliding signals, the processing circuitry is further configured to shift the plurality of signals by a plurality of offset distances and match the plurality of shifted reference signals and the sliding signal to determine the linear position where the linear position correspond to one of the plurality of offset distances. In an example, each of the linear positions corresponds to a position of an edge of the particular object. In an example, each of the linear positions corresponds to a center position of one of the plurality of signals.

In an embodiment, the surface of the sensing apparatus is a substantially planar surface and the particular object is in contact with the surface when the particular signal is received by the processing circuitry. The reference signals further include a plurality of reference tilting signals for each of the reference objects. After the particular object is identified, the processing circuitry is further configured to receive tilting signals when one surface of the particular object is tilted around an axis in the planar surface and determine tilting angles based on the plurality of reference tilting signals and the received tilting signals. The tilting signals correspond to the tilting angles formed by the surface of the particular object and the planar surface.

In an embodiment, the surface of the sensing apparatus is a substantially planar surface and the particular object is in contact with the surface when the particular signal is received by the processing circuitry. The reference signals of the reference objects include a plurality of signals for the one of the reference objects. The particular object has a cylindrical surface with an axis of rotation and includes a metallic tape covering a portion of the cylindrical surface. After the particular object is identified, the processing circuitry is further configured to receive rotation signals when the particular object is rotated around the axis of rotation where the rotation signals correspond to rotation angles. The processing circuitry can determine the rotation angles based on the stored reference signals of the reference objects and the received rotation signals.

Aspects of the disclosure provide a sensing method of a sensing device including resonators having respective resonant frequencies. The resonators include an array of inductive coils positioned on a surface of an apparatus. The sensing device is configured to output a signal indicating changes of the resonant frequencies of the inductive coils caused by presence of an object proximate to the surface of the apparatus. The sensing method includes storing, for each reference object of a plurality of reference objects, a reference signal corresponding to the reference object. The reference signal indicates changes of the resonant frequencies of the inductive coils caused by presence of the reference object proximate to the surface of the apparatus. The sensing method also includes receiving, from the sensing device, a particular signal caused by presence of a particular object proximate to the surface of the apparatus. The particular signal indicates changes of the resonant frequencies of the inductive coils caused by the presence of the particular object. The sensing method also includes comparing the particular signal with the stored reference signals of the reference objects to determine an identity of the particular object.

In an embodiment, the sensing method further includes executing a particular application associated with the determined identity of the particular object, when determining the identity of the particular object.

In an embodiment, the surface is a substantially planar surface, the particular object is in contact with the surface, and the reference signals of the reference objects include a plurality of signals for each of the reference objects. After identifying the particular object, the sensing method further includes receiving sliding signals when the particular object is sliding along an axis in the planar surface and determining linear positions based on the plurality of signals and the received sliding signals. The sliding signals correspond to the linear positions of the particular object along the axis.

In an embodiment, the surface is a substantially planar surface, the particular object is in contact with the surface, and the reference signals further include a plurality of reference tilting signals for each of the reference objects. After identifying the particular object, the sensing method further includes receiving tiling signals when one surface of the particular object is tilted around an axis in the planar surface and determining the tilting angles based on the plurality of reference tiling signals and the tilting signals. The tilting signals correspond to tilting angles formed by the surface of the particular object and the planar surface.

In an embodiment, the surface is a substantially planar surface, the particular object is in contact with the surface, and the reference signals further include a plurality of reference signals for each of the reference objects. The particular object has a cylindrical surface with an axis of rotation and includes a metallic tape covering a portion of the cylindrical surface. After identifying the particular object, the sensing method further includes receiving rotation signals when the particular object is rotated around the axis of rotation and determining rotation angles based on the stored reference signals of the reference objects and the rotation signals. The rotation signals correspond to the rotation angles.

BRIEF DESCRIPTION OF THE DRAWINGS

Further features, the nature, and various advantages of the disclosed subject matter will be more apparent from the following detailed description and the accompanying drawings in which:

FIGS. 1A-1C show an exemplary schematic diagram of a sensing apparatus 100 according to an embodiment of the disclosure;

FIGS. 10A-10C show exemplary signals according to an embodiment of the disclosure;

DETAILED DESCRIPTION OF EMBODIMENTS

Figure 2A:
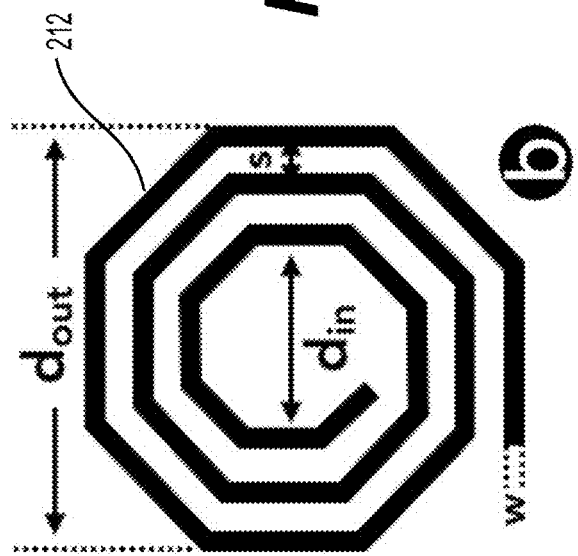
FIGS. 2A-2D show examples of inductive coils according to embodiments of the disclosure.
Figure 2B:
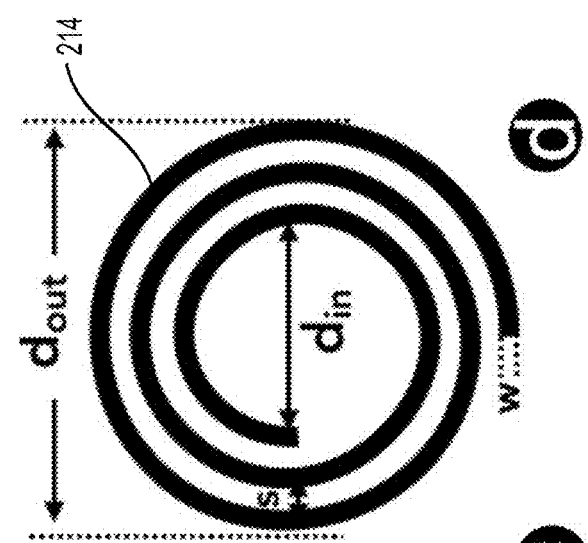
Figure 2C:
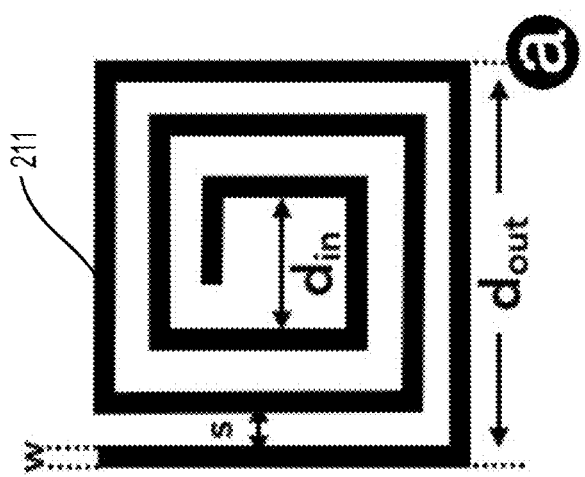

A sensing apparatus and a sensing method for inductive sensing (i.e., sensing that is based on induction), such as used in contextual interactions are disclosed. FIG. 1A shows an exemplary schematic diagram of a sensing apparatus 100 according to an embodiment of the disclosure. The sensing apparatus 100 can include a sensing device 110, processing circuitry 132, memory 150, and a bus 160 that couples the sensing device 110, the processing circuitry 132, and the memory 150. In an example, the processing circuitry 132 can include a measurement circuit 120, a controller 130, and a computer 140.

The sensing device (or sensor) 110 can include resonators, such as L-C resonators 111-115 having respective resonant frequencies. Each of the L-C resonators 111-115 can include an inductive coil (or coil), and thus the L-C resonators 111-115 include an array of inductive coils 171-175. Referring to FIG. 1B, the sensing apparatus 100 can further include a mechanical structure 131 having a plurality of surfaces or sides, such as the surfaces 101-103. In general, the surfaces 101-103 can have any suitable shape(s) and curvature(s). The array of inductive coils 171-175 can be positioned on the surface 103, and thus the surface 103 can be referred to as a sensing surface 103. In an example, the surface 103 is a substantially planar surface.

In an example, the processing circuitry 132 (including the measurement circuit 120, the controller 130, and the computer 140) and the memory 150 can be located within the mechanical structure 131. The array of the inductive coils 171-175 can be positioned on the surface 103, and remaining portions of the L-C resonators 111-115 are located in the mechanical structure 131.

The memory 150 can be configured to store a database including reference signals of reference objects. The reference signals can be pre-determined and indicate changes of the resonant frequencies caused by the respective reference objects to the L-C resonators 111-115 in the sensing device 110.

The processing circuitry 132 can be configured to measure a signal caused by an object of interest (or object 135) when a distance between the object 135 and the surface 103 is less than a distance threshold. In an example shown in FIG. 1B, a user can tap the object 135 on the surface 103. Thus a surface 134 of the object 135 is in contact with the surface 103 and the distance is zero. The signal can indicate changes of the resonant frequencies of the L-C resonators 111-115 caused by the object 135 tapping the surface 103. The processing circuitry 132 can be configured to compare the signal with the reference signals of the reference objects in the database to determine whether the object 135 can be identified as one of the reference objects in the database, i.e., for object recognition. The processing circuitry 132 can compare the signal with each of the reference signals of the respective reference object using a k-nearest neighbors algorithm (KNN). The processing circuitry 132 can further determine, based on the signal, a length of the object 135 (along an X axis) that is contact with the surface 103.

In an embodiment, the reference signals of the reference objects include a plurality of reference signals for the one of the reference objects. After the object 135 is identified as the one of the reference objects, the processing circuitry 132 can measure sliding signals when the object 135 is sliding, for example, along the X axis in the surface 103. The sliding signals correspond to linear positions of the object 135 along the X axis. The processing circuitry 132 can determine the linear positions based on the plurality of reference signals and the sliding signals.

In an embodiment, the reference signals include a plurality of reference tilting signals for the one of the reference objects. After the object 135 is identified as the one of the reference objects, the processing circuitry 132 can measure tiling signals when the surface 134 of the object 135 is tilted around the X axis away from the surface 103 where the tilting signals correspond to tilting angles formed by the surface 134 and the surface 103. The tilting angle can be zero when the surfaces 134 and 103 are parallel. The processing circuitry 132 can determine the tilting angles based on the plurality of reference tiling signals and the tilting signals.

In an embodiment (not shown in FIGS. 1A-1B), a rotation of an object can be detected by the sensing apparatus 100.

The object 135 can be any suitable object, such as a conductive object with a conductivity that is above a conductivity threshold. The object 135 can be a metallic object found in households and daily environments. According to aspects of the disclosure, when the object 135 is placed within a certain distance from the sensing surface 103, the object 135 can be detected or recognized as described above.

Further, movements of the object 135 including lateral movements, such as sliding, hinging (or tiling), and rotation with respect to the sensing surface 103 can be detected.

In an example, when the object 135 is placed against (or touches) the sensing surface 103, the object 135 and/or the movements of the object 135 can be recognized, and thus the inductive sensing can be referred to as contact-based inductive sensing. The contact-based inductive sensing can be used for precise detection, classification, and manipulation of various conductive objects, such as utensils or small electronic devices. In an embodiment, a user can tap a conductive object or a finger on a sensing surface of an electronic device (e.g., a smartwatch) to trigger an action, such as opening an application on the smartwatch. When the conductive object is detected, the user can use the same conductive object as a continuous one-dimensional (1D) input, for example, by moving the conductive object continuously in 1D (e.g., along the X axis) to control the application on the smartwatch. The continuous 1D input or the movement can include sliding, hinging, or rotation, depending on a specific situation. Thus, a context embedded item can be used to indicate a desired application followed by a continuous input without switching the conductive object.

Characteristics (e.g., a size, a shape, an inductance) of the inductive coils 171-175, a layout or arrangement of the inductive coils 171-175, and/or a number of the inductive coils 171-175 can be determined based on device performance or requirements, such as a sensitivity, a sensing range (or a sensing distance), a recognition accuracy for object recognition (i.e., how accurately the object 135 can be recognized), and a tracking accuracy for object tracking (i.e., how accurately a movement of the object 135 can be tracked). The sensing device 110 and/or the sensing apparatus 100 can be used in or together with any suitable devices or any suitable form factors, such as a small electronic device, a wearable electronic device (e.g., a smartwatch). In an example, the sensing apparatus 100 includes the electronic device. Referring to FIG. 1B, in an example, a wearable device, such as a smartwatch, can be enclosed by the mechanical structure 131. The surface 101 can be the touchscreen of the wearable device. When the array of inductive coils 171-175 are positioned on the surface 103, and the object 135 can be used to control operations of various applications displayed on the surface 101 by tapping the object 135 on the surface 103 and/or moving with respect to the surface 103. The sensing apparatus 100 and the electronic device can communicate via any suitable communication technologies, such as wired, wireless, fiber-optics, and/or the like. Accordingly, an application in the electronic device may be controlled via the sensing apparatus 100.

Figure 3A:
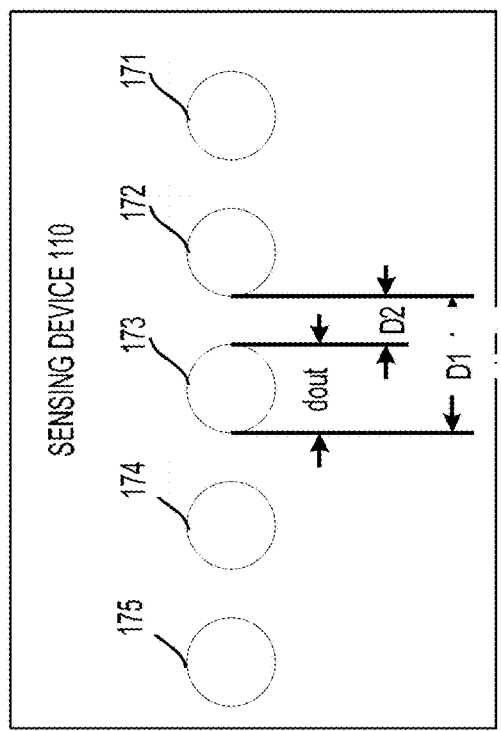
FIGS. 3A-3B show examples of arrangement of inductive coils according to an embodiment of the disclosure.
Figure 3B:
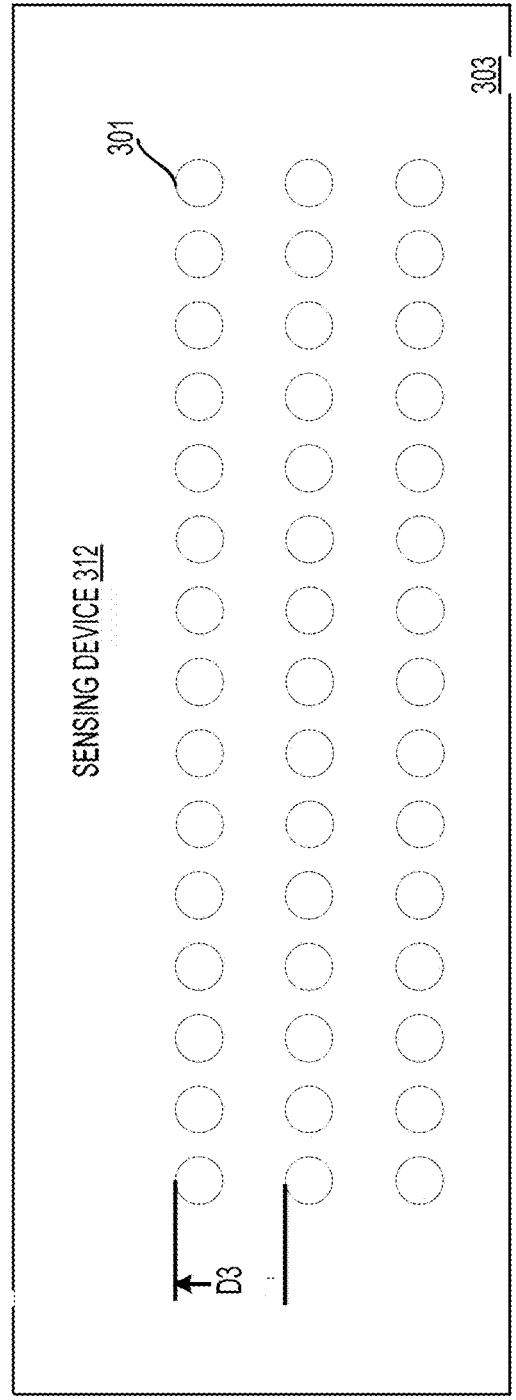

Any suitable layout and any suitable number of coils can be used in the sensing device 110. In an example, the array of inductive coils 171-175 is a linear array and the inductive coils 171-175 are arranged in a straight line, such as shown in FIG. 3A. The number of inductive coils 171-175 is 5 in FIG. 3A. FIG. 3B shows an exemplary sensing device 312 including a two-dimensional (2D) array of 3×15 inductive coils 301 on a planar surface 303. Parameters or sizes affecting device performance can include an outer dimension dout, an interval D2 between two adjacent inductive coils along the X axis, a distance D3 between 2 adjacent rows of coils along the Z axis, and/or the like. The distance D1 is equal to a sum of dout and D2. Coils in the sensing device 100 can be arranged in any suitable pattern, such as a linear array, a 2D array, in a curved surface, or in 3D.

In an example, the inductive coils 171-175 are spiral coils that have a circular shape. The inductive coils 171-175 can be planar spiral coils.

The sensing device 110 can be used with any suitable object, such as a conductive object, a non-conductive object, or the like. The object 135 can be an object, such as a fork, a smartphone, or the like found in households, and thus no instrumentation is necessary. Of course, the object 135 can also be instrumented, for example, by including a metallic tape on the object 135. Further, the sensing apparatus 100 can be configured to detect various conductive objects including electrical objects or non-electrical objects, thus the sensing apparatus 100 is not limited to detecting electrical objects. As described above, the sensing apparatus 100 can detect the movements of the object 135, such as sliding, tilting, and rotation.

The memory 150 can be any suitable device for storing data and instructions to control operations of the measurement circuit 120, the controller 130, the processing circuitry 132, the computer 140, and/or the like. In an example, the memory 150 stores measurement results, such as resonant frequencies, inductances, and software instructions to be executed by a processor, such as the controller 130, the computer 140, and/or the processing circuitry 132. The memory 150 can store the database including the reference signals of the reference objects. In an example, the memory 150 can store a plurality of reference signals, such as 10 reference signals, for each of the reference objects. In an example, the memory 150 can store a plurality of reference tilting signals for the reference objects.

The memory 150 can be non-volatile memory, such as read-only memory, flash memory, magnetic computer storage devices, hard disk drives, solid state drives, floppy disks, and magnetic tape, optical discs, and the like. The memory 150 can include a random access memory (RAM). The memory 150 can include non-volatile memory and volatile memory.

The controller 130 can be configured to control operations of the measurement circuit 120 and the memory 150. Alternatively or additionally, the controller 130 can also be configured to interface the measurement circuit 120 and the computer 140. The controller 130, the measurement circuit 120, the processing circuitry 132, and/or the computer 140 can be implemented using various techniques, such as integrated circuits, one or more processors executing software instructions, and the like. In an example, the processing circuitry 132 is implemented using integrated circuit(s).

FIG. 1C shows an exemplary L-C resonator, the L-C resonator 111, according to an embodiment of the disclosure. The L-C resonator 111 can include an inductor or the inductive coil 171 and a capacitor 181. A resonant frequency $f_0$ of the L-C resonator 111 can depend on a capacitance C of the capacitor 181 and an inductance L of the coil 171, as shown in Eq. (1).

$$f_0 = \frac{1}{2\pi\sqrt{LC}} \quad (1)$$

The L-C resonator 111 can be connected to the measurement circuit 120 configured to measure the resonance frequency of the L-C resonator 111. In an example, when the capacitance of the capacitor 181 and the resonant frequency of the L-C resonator 111 are known, the inductance of the coil 171 can be determined.

The L-C resonators 112-115 can have similar or identical components and structures as those of the L-C resonator 111, and thus have similar or identical functions as those of the L-C resonator 111. Accordingly, detailed descriptions of the L-C resonators 112-115 can be omitted for purposes of brevity. In an example, the measurement circuit 120 can include a plurality of channels where each channel can be connected to a respective one of the L-C resonators 111-115, and thus resonant frequencies of the L-C resonators 111-115 can be measured by the plurality of channels in the measurement circuit 120 in a parallel process.

Referring to FIG. 1C, during operation, an alternating current (AC) current flows in the coil 171. When a conductive object, such as the object 135, is in a vicinity of the coil 171, the coil 171 and the object 135 are coupled. Accordingly, the object 135 and/or a movement of the object 135 with respect to the coil 171 can affect the inductance of the coil 171 and thus the resonant frequency of the L-C resonator 111. An inductance change in the L-C resonator 111 can result in a frequency shift of the resonant frequency. As the frequency shift can be measured by the measurement circuit 120, the inductance change can be determined. Further, the inductance of the coil 171 can be affected by resistivity, a size, a shape of the object 135, and/or a distance between the coil 171 and the object 135. Accordingly, material (via the resistivity), the size, the shape of the object 135, and/or the distance between the coil 171 and the object 135 can be obtained. Accordingly, when the object 135 is in a vicinity of the sensing device 110, material, the size, the shape of the object 135, and/or respective distances between the coils 171-175 and the object 135 can be obtained by measuring changes of the resonant frequencies caused by the object 135.

In various examples, inductive sensing enables low-cost, high-resolution sensing of conductive objects, such as metallic objects. Inductive sensing is based on Faraday's law of induction where a first current-carrying conductor can "induce" a current to flow in a second conductor. In an example, an AC current flowing through an inductor (e.g., the coil 171) can generate a first electromagnetic field. When a conductive object is brought into a vicinity of the inductor, the first electromagnetic field can induce a circulating current (referred to as an eddy current) on a surface of the conductive object. The induced eddy current can generate a second electromagnetic field that opposes the first electromagnetic field generated by the inductor. As such, the inductor and the conductive object can form two coupled inductors, and the coupling between the inductor and the conductive object can affect a resonant frequency of an L-C resonator that includes the inductor.

An important property of a resonant circuit such as an L-C resonator is the ability to resonate at a resonant frequency $f_0$. The effect of the electromagnetic field disturbance caused by approximating the conductive object can result in a shift (or change) of the inductance L. The shift of the inductance L can be observed as a shift (or change) in the resonant frequency $f_0$. When both the resonant frequency $f_0$ and the capacitance C are known, the resulting inductance L of the inductor can be calculated using Eq. (1). The inductance L of the inductor can be affected by, for example, the resistivity, a size, and a shape of the conductive object and a distance between the inductor and the conductive object. Accordingly, the material (via resistivity), the size, the shape and the distance can be obtained or inferred by measuring the resonant frequency $f_0$ of the L-C resonator.

Various conductive objects have a capacitance and an inductance, and both properties (i.e., the capacitance and the inductance) can affect the resonant frequency $f_0$. For most metallic objects, the effect of the inductance dominates that of the capacitance. In contrast, the effect of capacitance can become dominant with various non-metallic conductive objects, such as a finger.

According to aspects of the disclosure, the sensing apparatus 100 does not rely on the capacitance for object recognition because capacitance is largely affected by a user's body that acts as a big capacitor and diminishes the effect on capacitance caused by an object. As such, the sensing apparatus 100 and the sensing work well with metallic objects (e.g., keys or utensils) or objects that mainly include metallic objects (e.g., electronic devices). Non-metallic conductive objects can include plant or food (e.g., fruits), and thus less suitable to be used for precise input. In an example, the sensing apparatus 100 can differentiate a finger from conductive objects due to the effects of capacitance and not inductance because the body of a user acts as a capacitor.

As described above, characteristics or parameters including a shape (or coil shape), a size (or coil size), an inductance (or coil inductance), and an arrangement (or coil arrangement) of the array of inductive coils 171-175 can affect inductive sensing performance of the sensing apparatus 100, such as a sensitivity, a sensing range (or sensing distance), and a recognition accuracy, and a tracking accuracy of the sensing apparatus 100. The inductive coils 171-175 in the sensing device 110 may be placed along a surface or a side of an electronic device, such as a smartwatch, and thus the inductive coils 171-175 can be placed within a rectangular region, such as an area of 10×40 mm (e.g., approximately a size of a side of a smartwatch).

Figure 2D:
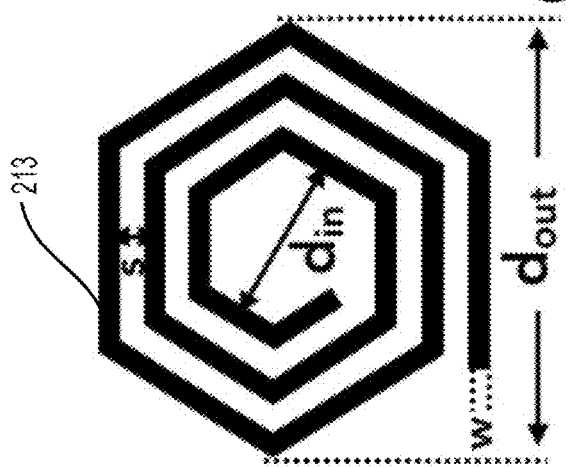

The coil shape can affect the sensing range that, for example, is important for tracking a hinge movement (or tilting) of the object 135. In general, a coil may be spiraled with two ends connecting to other components, such as a capacitor, of an L-C resonator. The inductive coils 171-175 can have any suitable shape including but not limited to a square, hexagon, octagon, and circle, as shown in FIGS. 2A-2D. FIGS. 2A-2D show exemplary planar spiral coils having different shapes including a square coil 211, a hexagon coil 212, an octagon coil 213, and a circular coil 214. Sizes of the coils 211-214 can include an outer dimension dout, an inner dimension din, a width W of each turn in the coils 211-214, and a turn interval S between adjacent turns of the coils 211-214. Referring to FIG. 2D, dout and din can also be referred to as an outer and inner diameters, respectively for the circular coil 214. In examples shown in FIGS. 2A-2D, the coils 211-214 include 3 turns.

In various examples, the circular coil 214 has a larger quality factor Q and a lower series resistance than those of the square coil 211, the hexagon coil 212, and the octagon coil 213, allowing a larger sensing range than those of the square coil 211, the hexagon coil 212, and the octagon coil 213, such as disclosed in a reference (Chris Oberhauser, "LDC Sensor Design", Application Report SNOA930A, March 2015 and revised April 2018, available as of Oct. 8, 2019 at http://www.ti.com/lit/an/snoa930a/snoa930a.pdf, hereinafter "Oberhauser"), which is incorporated herein by reference in its entirety. Accordingly, the circular coil 214 can be used in the sensing device 110 to obtain a relatively large sensing range.

A first sensor value of the circular coil 214 varies with a first distance between the circular coil 214 and an object to be detected. A second sensor value of the rectangular coil 211 varies with a second distance between the rectangular coil 211 and the object. In an example, the first sensor value is not as linearly proportional to the first distance when compared with a relationship between the second sensor value and the second distance.

In general, a coil size can affect a sensing range. The sensing range can increase when the coil size increases. In some examples, the coil size can have a larger effect on the sensing range when compared with the coil shape, such as disclosed in Oberhauser. The coil size of the inductive coils 171-175 may be constrained by a size of the mechanical structure 131. Referring to FIG. 1B, for example, the coil size may be constrained by a size (e.g., a height Hs along a Z axis and/or a length Ds along the X axis) of the sensing surface 103. A number of coils in the sensing device 110 can also be constrained by the size of the mechanical structure 131 or the sensing surface 103. A size, shape, and a lateral movement of an object, such as the object 135, positioned against the sensing surface 103 can be sensed with an array of relatively small and clustered coils (e.g., a 3×15 array of coils shown in FIG. 3B). A hinge movement can be detected with relatively large coil(s). In some examples using daily objects and certain measurement circuits, a sensing range of a circular coil can be approximately 1 to 1.5 times of the coil size (or an outer diameter). In an example, the sensing device 110 includes a linear array of five circular coils 171-175 where each has a circular shape as shown by the circular coil 214. The outer diameter dout of the circular coils 171-175 can be from 7 to 10 mm, such as about 7.39 mm and a distance D2 between two adjacent coils can be from 0.5 to 1 mm, such as about 0.76 mm.

Figure 2E:
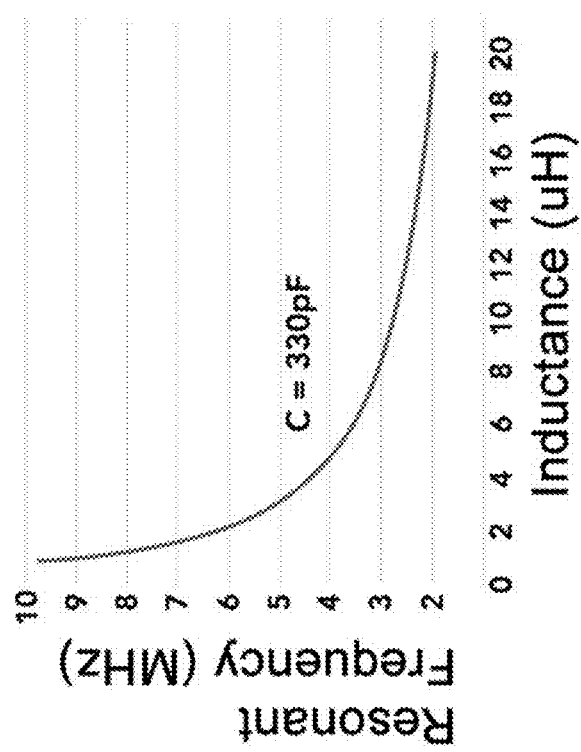
FIG. 2E shows a relationship between a resonant frequency and an inductance of a L-C resonator according to an embodiment of the disclosure.

Coil inductance can influence an intensity of an electromagnetic field, thus affecting the sensitivity to a small change in a resonate frequency caused by different materials, sizes, or shapes of objects to be detected, such as disclosed in Oberhauser. FIG. 2E shows an exemplary relationship between a coil inductance and a corresponding resonant frequency at a certain capacitance, such as 330 pF. FIG. 2E shows that a larger or more pronounced change in the resonant frequency (e.g., steeper curve) can be detected for a same amount of inductance change when the inductance is lower or smaller. Thus, in some examples, a coil with a lower inductance (or higher resonant frequency) may be used to obtain a higher sensitivity.

Therefore, for each design solution, we calculated the corresponding inductance value can be calculated and a lowest inductance can be selected. The inductance $L_{single}$ of a singular layer of coil can be determined by parameters, such as a number of turns n of the coil, an inner diameter din, an outer diameter dout, and geometry dependent parameters c1-c4. The inductance $L_{single}$ can be calculated using the current sheet approximation formula as below:

$$L_{single} = \frac{\mu n^2 d_{avg} c_1}{2}\left(\ln\left(\frac{c_2}{\rho}\right) + c_3\rho + c_4\rho^2\right) \qquad (2)$$

where $\mu$ is the permeability of free space, $4\pi \times 10^{-7}$, $d_{avg}$ is the average diameter of the turns, and is defined as davg=$(d_{out}+d_{in})/2$, $\rho$ represents a fill ratio of the coil and is defined as $(d_{out}-d_{in})/(d_{out}+d_{in})$, c1-c4 are geometry dependent parameters (e.g., for a circular coil, $c_1$=1.0, $c_2$=2.46, $c_3$=0, = 0.2).

For multi-layer coils, the total inductance Ltotal of the coils in series can be calculated using the following formula below, such as disclosed in Oberhauser:

$$L_{total} = \sum_{i=1}^{N} L_i + 2 \cdot (\sum_{j=1}^{N-1} \sum_{m=j}^{N} M_{j,m}) \qquad (3)$$

where $M_{j,m}$ is the mutual inductance between the coils and is defined as $k \cdot \sqrt{L_j L_m}$. The parameter k is a measure of the flux linkage between the coils and varies between 0 and 1. The value of k can be estimated using the formula below:

$$k = \frac{n^2}{0.64 * (1.67n^2 - 5.84n + 65) * (Ax^3 - Bx^2 + Cx + D)} \quad (4)$$

where x is the distance in millimeters between the two adjacent layers and n is the number of turns of the coil. A, B, C, D are four constant parameters with the value of 0.184, −0.525, 1.038, and 1.001, respectively.

In an example, an upper bound of the resonant frequency can be constrained by device performance of the processing circuitry 132. In an example, the measurement circuit 120 can include an inductance to digital converter, such as the LDC1614 from TI. In an example, a maximum resonant frequency of 10 MHz can be measured. Additionally, the signal stability of the inductance to digital converter may also limit the maximum resonant frequency. For example, the readings of the LDC1614 can be unstable when the resonant frequency exceeds 5 MHz. Therefore, a resonant frequency is constrained to be less than or equal to 5 MHz.

Manufacturing processes of the inductive coils 171-175 can also constrain certain size parameters of the coils 171-175. For example, the width W of the turns in the coils 171-175 can be 6 mils (0.15 mm) wide with a minimum 6 mil turn interval S between two adjacent traces or turns. Table 1 shows 4 designs where dout and din are the outer diameter and inner diameter of the coils, and Turns are the number of circles in a coil. In an example, the coils 171-175 are designed according to the first row of Table 1 and have the lowest inductance of 3.56 uH. Accordingly, the coils 171-175 have dout of 7.39 mm, din of 2.21 mm, 4 layers, each layer has 8 turns, resulting in the inductance of 3.56 uH and a resonant frequency of 4.64 MHz when the capacitance C is set to be 330 pF. In various examples, coil parameters including but not limited to sizes, shapes, and the like are determined to have a resonant frequency, such as 4.64 MHz, in a frequency range with minimal environment or background EMI or noise.

TABLE 1

Coil designs

| $d_{out}$ (mm) | $d_{in}$ (mm) | Layers | Turns | Inductance (uH) | Frequency (MHz) |
|---|---|---|---|---|---|
| 7.39 | 2.21 | 4 | 8 | 3.56 | 4.64 |
| 7.39 | 1.60 | 4 | 9 | 4.0 | 4.38 |
| 7.39 | 0.99 | 4 | 10 | 4.31 | 4.22 |
| 7.39 | 0.38 | 4 | 11 | 4.49 | 4.14 |

Figure 4A:
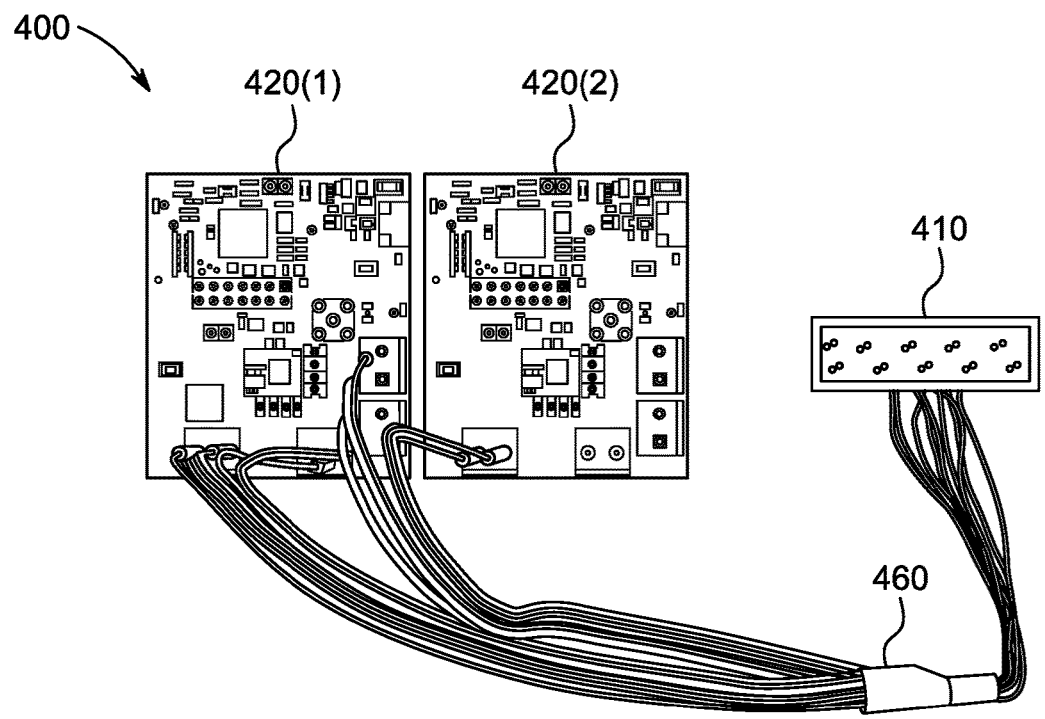
FIGS. 4A-4B show an example of sensing apparatus according to an embodiment of the disclosure.
Figure 4B:
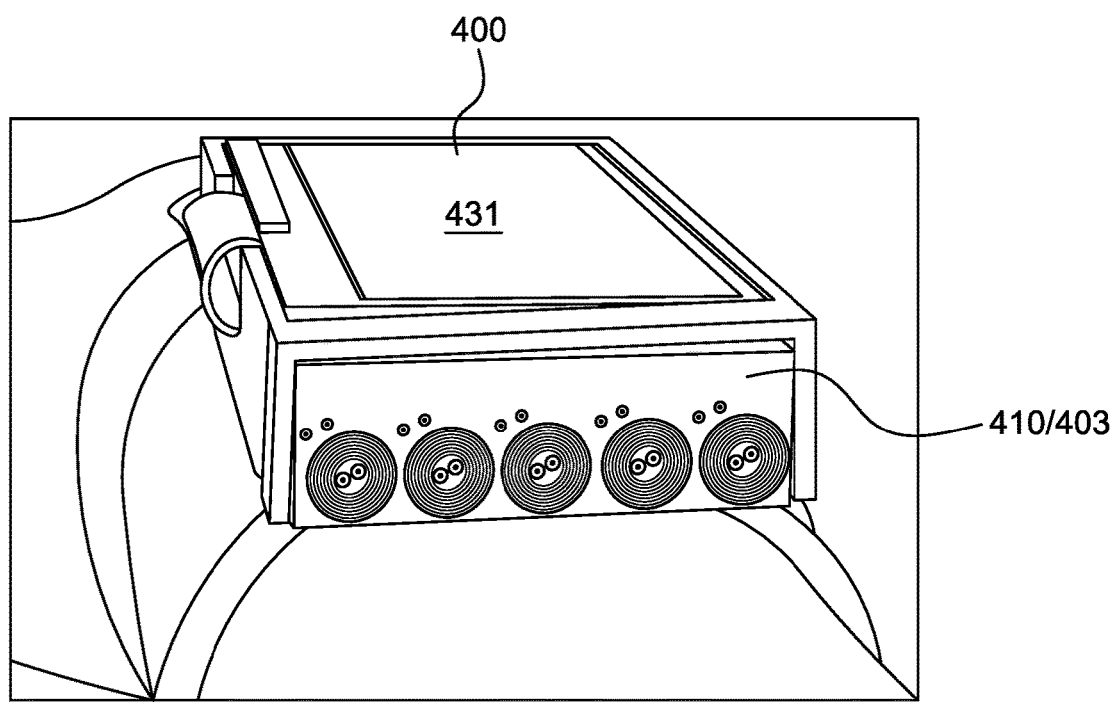

FIGS. 4A-4B shows an implementation 400 of the sensing apparatus 100 according to an embodiment of the disclosure. The implementation 400 includes a sensing device 410. The sensing device 410 includes an array of 5 circular coils designed and manufactured based on the first row of Table 1. Two LDC1614 evaluation boards (or boards) 420(1)-(2) from Texas Instruments including two 28-bit inductance to digital converters (e.g., LDC1614) that measure the resonance frequencies of the 5 circular coils. The coils in the sensing device 410 are connected to the two boards 420(1)-(2) via a bus 460. Each board can have a 28-bit inductance to digital converter (e.g., LDC1614) and a MSP430 microcontroller (MCU), used to interface the LDC1614 chip to a host computer. The LDC1614 chip has four output channels, one for each coil. The two LDC1614 chips can monitor the resonant frequencies of the L-C resonators in the sensing device 410 and report the corresponding inductance values (or inductance). In an example, the sensing chip is developed to primarily respond to the inductance effect of a metallic object. As such, the capacitive effect of human body (e.g., hand flex) can be neglected. The implementation 400's sampling rate can be set to 50 Hz. In an example, the LDC1614 chip and coils consumes 10 mW when working and 0.1 mW in a sleep mode. In an example, the power consumption of each module is 103.8 mW, primarily from the MSP430 MCU. Referring to FIG. 4B, the implementation 400 includes a mechanical structure 431 and the sensing device 410 is positioned on a surface 403 of the mechanical structure 431.

Figure 5B:
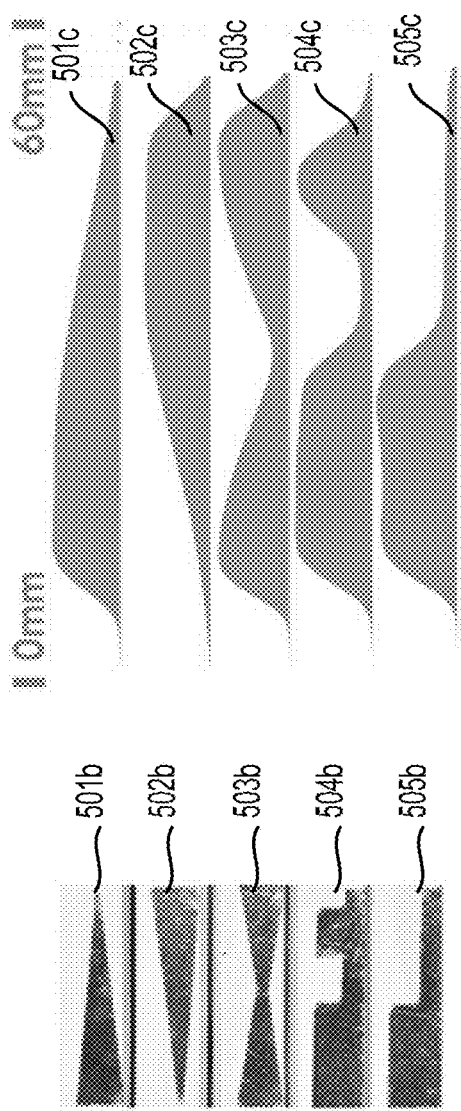
FIGS. 5A-5D show examples of objects and corresponding signals according to an embodiment of the disclosure.
Figure 5A:
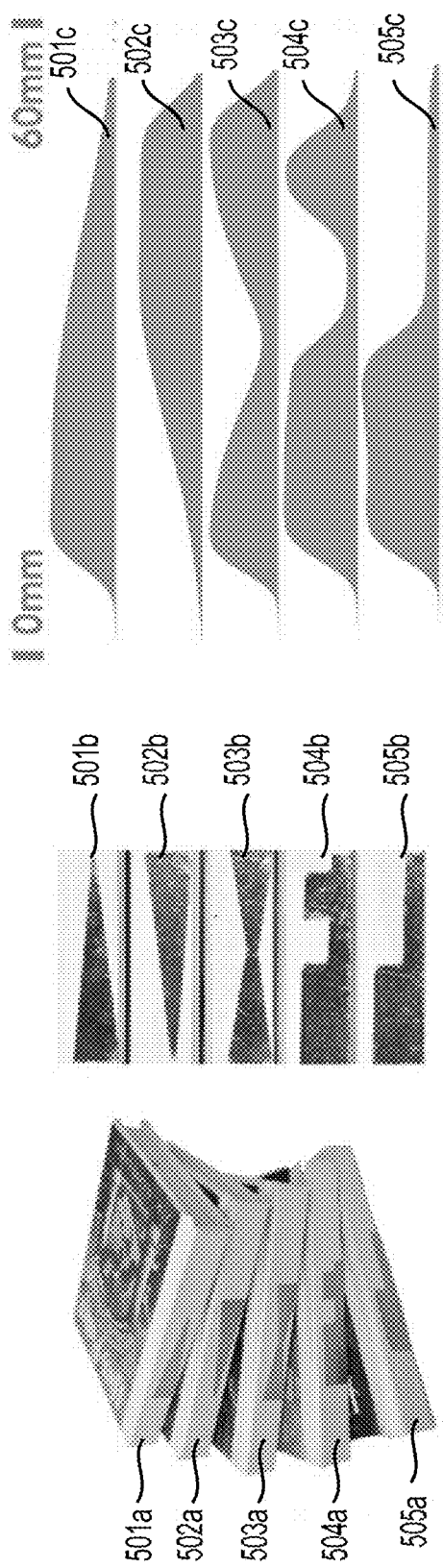
Figure 5D:
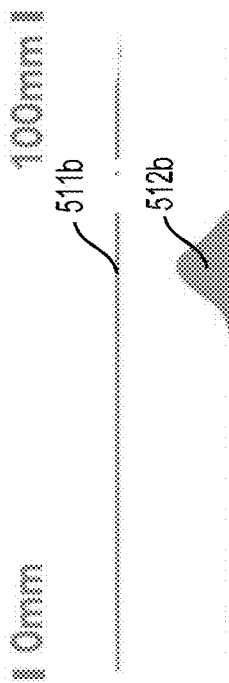
Figure 5C:
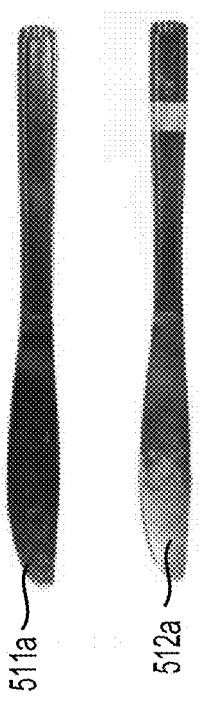
Figure 6A:
FIGS. 6A-6D show different types of objects according to an embodiment of the disclosure.
Figure 6B:
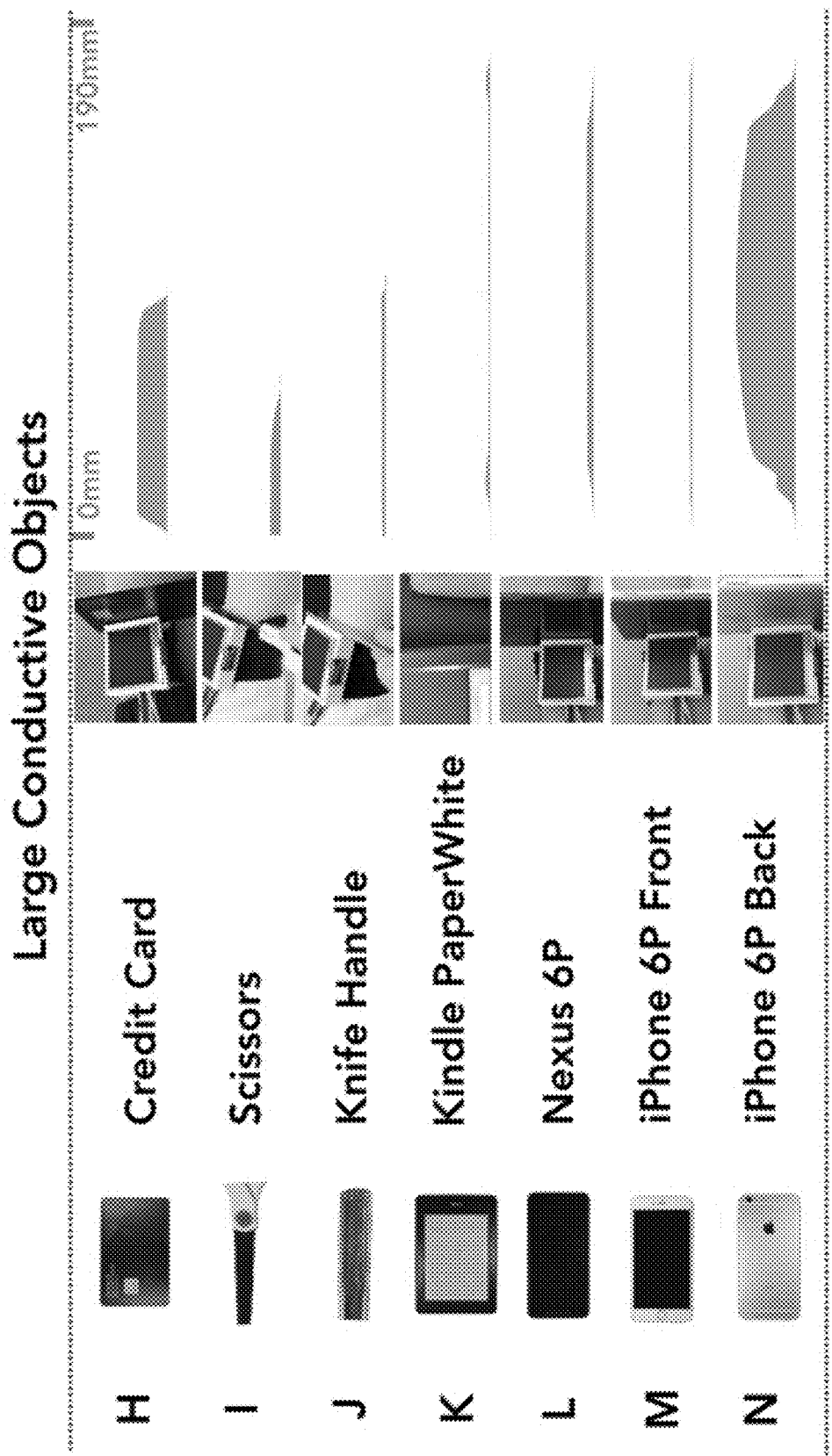
Figures 6C, 6D:

Different types of conductive objects can be classified as environmental conductive objects or artificial conductive objects. Environmental conductive objects can refer to conductive objects that occur in a user's home or office environment, such as a USB stick or table knife. For example, the environmental conductive objects are not instrumented with a conductive marker in the contact area. The contact area can refer to an area in contact with the surface 103. Artificial conductive objects can refer to objects that are instrumented using a conductive marker in the contact area. FIGS. 5A-5D show examples of conductive objects and corresponding inductance footprint according to aspects of the disclosure. By pressing the conductive marker to the sensing surface 103 of the sensor 110, the associated object can be recognized, and thus certain non-conductive objects instrumented with the conductive markers may be recognized. A conductive marker can be made by using a piece of copper tape on both conductive and non-conductive objects. For example, instrumenting a book using a copper tape allows the book to be used as an input device. FIG. 5A shows 5 different patterns of copper tapes 501b-505b instrumented onto 5 books 501a-505a, respectively. FIG. 5B shows 5 corresponding signals or inductance footprints 501c-505c (signals generated by the sensor 110) of the 5 books 501a-505a, respectively. Attaching the copper tape on a conductive object changes the inductance footprint of the conductive object, creating a new input device using the same object, as shown in FIGS. 5C-5D. An inductance footprint 511b of the knife 511a without instrumentation is different from an inductance footprint 512b of the knife 512a with instrumentation. In general, different patterns can be used to design the shape of the copper tape, thus increasing the vocabulary of the conductive marker.

FIGS. 6A-6D show various examples of objects. 23 objects A-W are shown in FIGS. 6A-6D and can be classified into four types: large conductive objects H-N, small conductive objects A-G, instrumented conductive objects O-Q, and instrumented non-conductive objects R-W. In an example, the large conductive objects H-N are objects whose contact areas are larger than a sensor, such as the sensing device 110. Some of the large conductive objects are metallic, while others are electronic devices with built-in metallic components. For the small conductive objects A-G, the contact area is smaller than the sensor. The instrumented conductive objects O-Q are conductive objects with a contact area instrumented, for example, using a strip of copper tape that is 10 mm wide. The instrumented non-conductive objects R-W are non-conductive objects with the contact areas instrumented using copper tape with different patterns. FIGS. 6A-6D also show how an object is held against the sensor, for example, for both training and testing. FIGS. 6A-6D also show corresponding inductance footprints of the 23 objects A-W, respectively.

Users can interact with the sensing apparatus 100, using contact-based interactions (e.g., tapping, hinging, sliding, or rotating a conductive object). FIGS. 7A-7D show various examples of the contact-based interactions according to aspects of the disclosure. In FIGS. 7A-7D, a smartwatch is used as an example where the sensing apparatus 100 also includes the smartwatch. The sensing device 110 is located on the surface 103 and the surface 101 is a touchscreen of the smartwatch. In one implementation, objects are to be in contact with the sensor or the sensing surface 103, for example, due to the relatively short sensing distance.

Figure 7A:
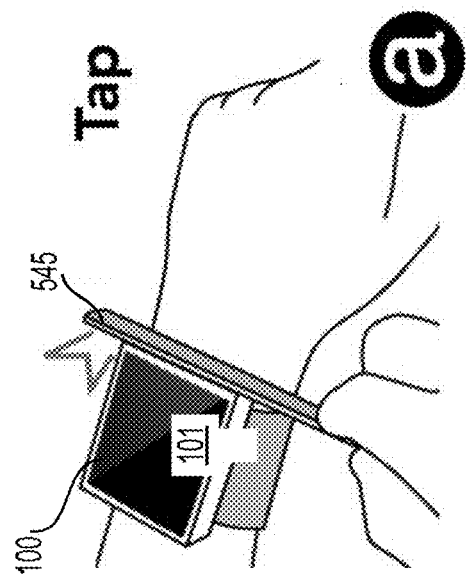
FIGS. 7A-7D show exemplary interactions between a sensing apparatus and objects according to an embodiment of the disclosure.

FIG. 7A shows an example of tapping an object 545 on the surface 103 by a user. The smartwatch recognizes the object and triggers an action. Tapping a different object can trigger a different action and thus serving as a shortcut to quickly launch a user's favorite application. Tapping at different locations along the surface 103 of the smartwatch can also trigger different actions.

Figure 7B:
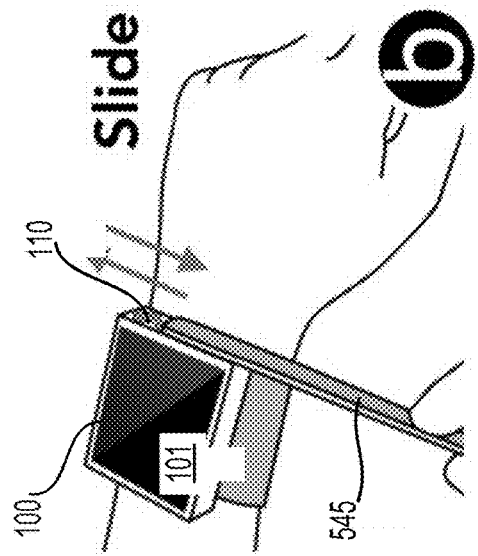

FIG. 7B shows an example of sliding the object 545 along an axis on the surface 103. After the object is recognized by the sensing apparatus 100, a user can slide the object along the surface 103 of the smartwatch for a continuous 1D input. The interaction is carried out on the surface 103 instead of on the touchscreen. The contact area of the object can be relatively planer, for example, to have control of the sliding movement.

Figure 7C:
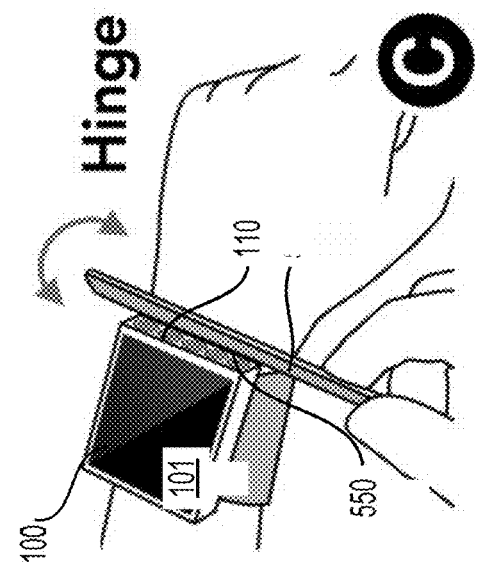

In addition to sliding, the user can hinge a thin and flat object (e.g., a handle of a table knife) by rotating the object along an edge 500 of the smartwatch, visually resembling a hinged door, as shown in FIG. 7C. Tilting can provide a continuous 1D input, and in a different dimension, thus increasing an input space for different application needs.

Figure 7D:
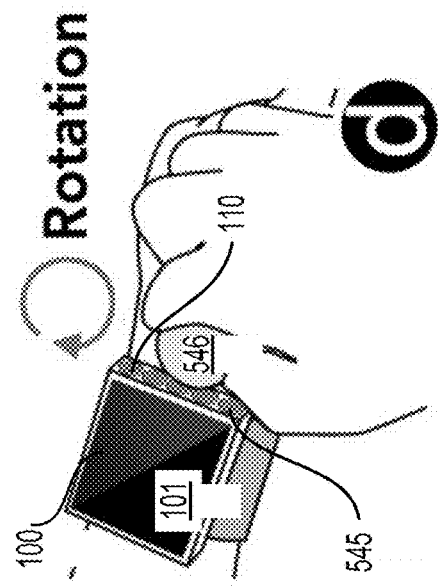

A user can also rotate a cylindrical object 546 (e.g., a bottle cap or marker pen) against the surface 103 of the smartwatch, as shown in FIG. 7D. The interaction is carried out on the surface 103 to avoid occluding the touchscreen (or the surface 101).

Figure 8:
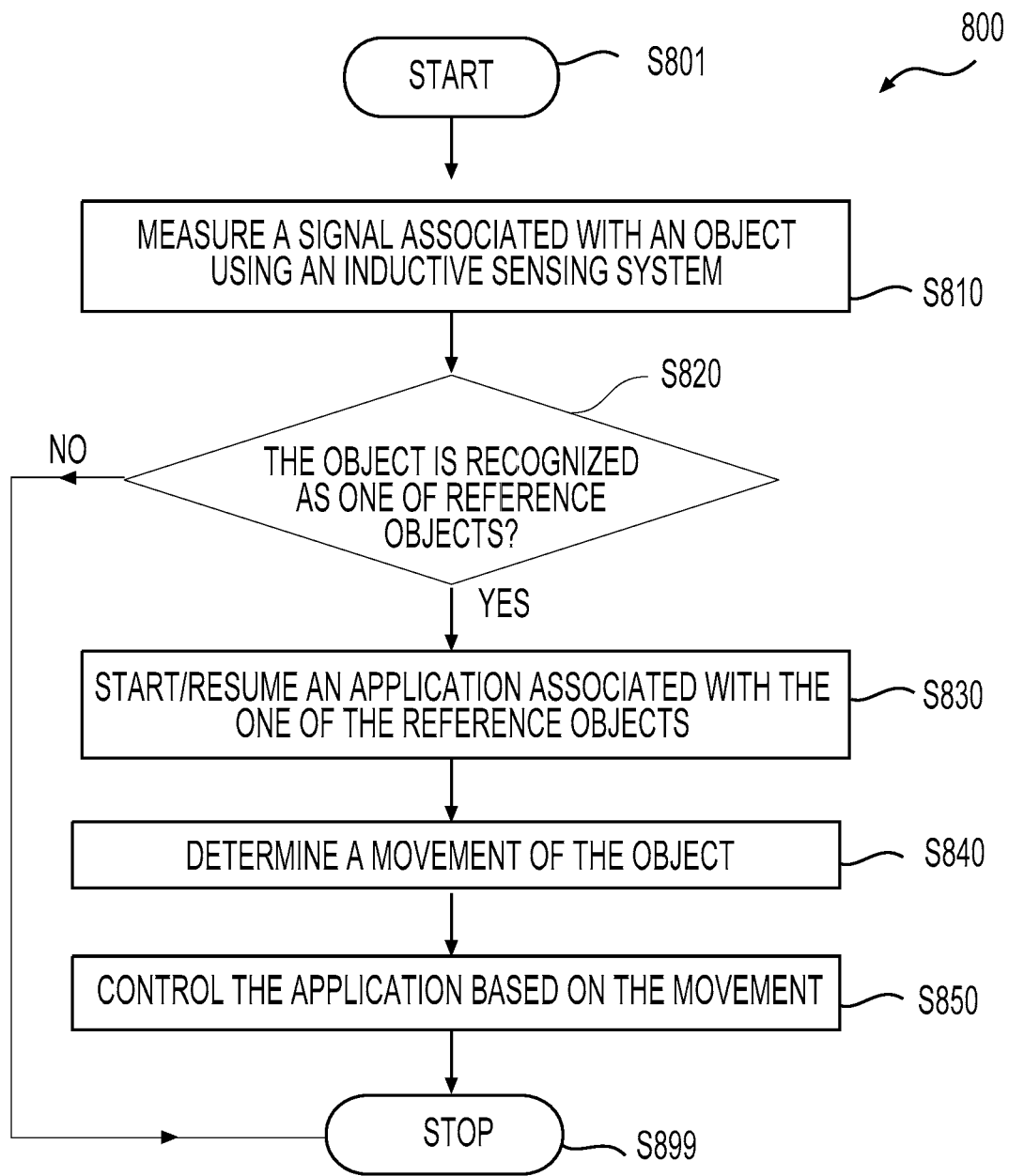
FIG. 8 shows a process 800 according to an embodiment of the disclosure.

FIG. 8 shows a process or a sensing method 800 according to an embodiment of the disclosure. The process 800 can be executed by any suitable inductive sensing apparatus, such as the sensing apparatus 100 as described above.

FIGS. 9A-9E show various scenarios where the process 800 can be implemented with the sensing apparatus 100. The array of inductive coils 171-175 of the sensing device 110 is positioned on the sensing surface 103 as a linear array. The sensing apparatus 100 includes a smartwatch, the surface 101 is a touchscreen of the smartwatch, and the sensing surface 103 is a planar surface. The process 800 starts at S801 and proceeds to S810.

Figure 9A:
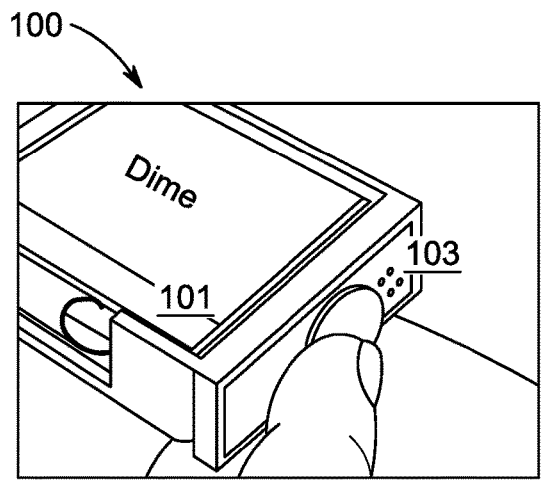
FIGS. 9A-9E show exemplary interactions between a sensing apparatus and objects according to an embodiment of the disclosure.
Figure 9B:
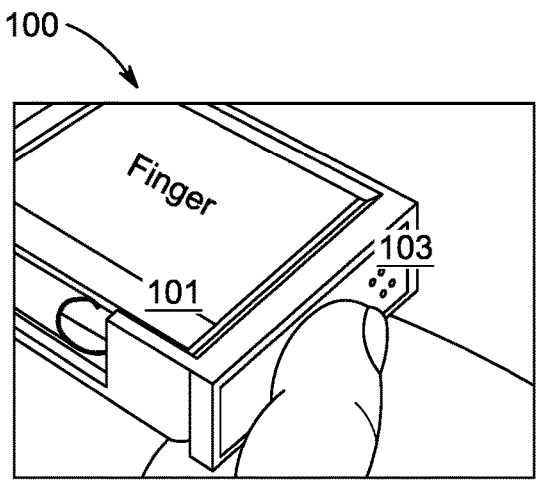

At S810, a signal associated with an object can be measured using an inductive sensing apparatus, such as the sensing apparatus 100. In an example, object recognition, such as real-time object recognition, is implemented. The object can be any suitable object that can cause a shift in one or more of the resonant frequencies of the sensing device 110. The object is a 'dime' in FIG. 9A and a 'finger' in FIG. 9B. Referring to FIGS. 9A-9B, a user can tap the object, such as the 'dime', or the 'finger', on any suitable location of the sensor or the sensing surface 103.

Upon an object tapping at a suitable location on the sensor, the sensor can report the signal, such as a 1D array of five consecutive inductance values, one from each of the coils 171-175, representing the inductance footprint of the object. As a signal associated with (or caused by) an object can be different from another signal caused by another object, the signal can also be referred to as the inductance footprint of the object. One exemplary inductance footprint 1002 represented by 5 discrete bars corresponding to 5 outputs from the 5 coils 171-175, respectively is shown in FIG. 10A.

At S820, whether the object is recognized or identified, for example, as one of reference objects can be determined. Real-time object recognition can be implemented by comparing the signal (also referred to as sensor data, inductance footprint, or testing footprint) with a database including, for example, labelled references. In an example, the labelled references can refer to the reference signals of the reference objects where the reference signals indicate changes of the resonant frequencies of the sensor 110 caused by the respective reference objects. The database can be pre-collected or pre-determined. In an example, one of the reference signals of one of the reference objects can generate a closest match, and thus the object can be identified as the one of the reference objects.

In an example, the signal or the testing footprint and the reference signals can be scaled, for example, to a same scale prior to comparing the 5-pixel testing footprint with the reference signals. The prediction can be made using any suitable algorithm, such as the k-nearest neighbors algorithm (KNN with k=8, for example). When a number of the reference objects is relatively large, algorithm(s) based on neural networks can be used. For the testing footprint, all the reference signals in the database can be iterated and a smallest distance to each of the reference signals can be calculated using:

$$\min_x \sum_{i=0}^{4} |f(x + d \times i) - y_i| \quad (5)$$

where x is the location inside the object's contact area, d is the distance (referred to as D1 in FIG. 3A) between two adjacent coils (e.g., 8.15 mm) of the sensing device 110, yi is the observed inductance value from the testing footprint, and f refers to the reference footprint. The prediction result can be obtained by a majority voting based on, for example, top eight candidates, ranked based on the similarity to the testing footprint. When the object is identified, the location of the object within the sensor can also be known.

Referring again to FIG. 10A, a reference signal or reference footprint 1001 (i.e., continuous line) of a type-C adaptor 1003 (shown in FIG. 10B) is also shown. The reference footprint 1001 is the prediction result that matches the best the inductance footprint 1002. Since the type-C adaptor 1003 corresponds to the reference footprint 1001, and thus the object can be identified as the type-C adaptor 1003.

To optimize a recognition accuracy, the object's contact area may be exposed to the sensor as much as possible. For example, in one example, the contact area can be within an area of the sensor if the object is smaller than the sensor. Otherwise, the sensor can be fully covered by the object. The object's contact surface can also be relatively planar, such that stable contact can be made against the sensor 110 or the sensing surface 103. How an object is in contact with the sensor may affect the geometry of the contact area, thus resulting in different inductance footprints, thus enabling new interactions but may cause ID collision. The inductance footprint provides a reliable indication of different objects, making it possible to maintain a shared database of common objects.

In addition to object material, the sensor data can also encode certain geometry information of the object's contact area (e.g., size and shape), and thus is beneficial for object recognition. In an example, the resolution of the geometry information can be low.

Referring to FIG. 10A, the reference footprint 1001 of an object can be a scan of the object's contact area, including a curve representation of 1D continuous inductance values across the object's contact area, representing a high-resolution inductance footprint of the object.

In an embodiment, the scan can be carried out using a single coil and a tracking mechanism that can measure the movement of the coil with a relatively high resolution, and thus providing one-to-one mapping between a location inside the contact area and a corresponding inductance value. An alternative approach is to scan without tracking the position of the coil, and thus a similar curve can be obtained, however, on a different scale on the horizontal axis (e.g., time) caused by the speed of the coil movement. Assuming the coil is moved in a constant speed, the collected data can be converted from a time domain to a physical size domain using a scale factor $S=(|t1-t2|)/(|d1-d2|)$ where t1 and t2 are two randomly chosen times and d1 and d2 are the corresponding coil locations, respectively. When the corresponding coil locations (e.g., d1 and d2) of the two randomly chosen times (e.g., t1 and t2) are known (e.g., measured manually), the scale factor S can be obtained. In an example, a signal or an inductance footprint and reference footprints can be compared in a same scale.

Figure 10C:
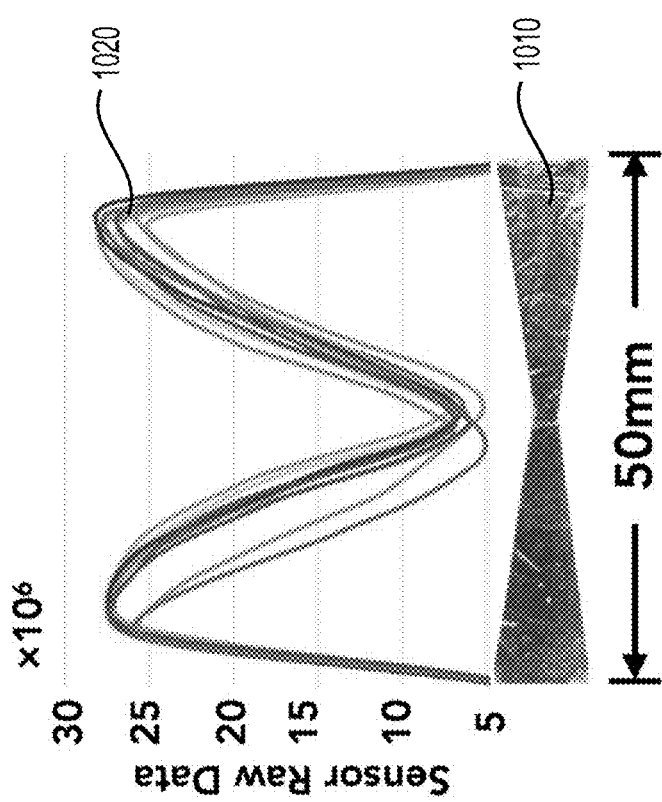

In an example, the object is scanned by hand or manually with the sensing device 110 wearing on the wrist. To accommodate the variance in scanning speeds during scanning by hand, multiple, such as ten, reference footprints for each object can be collected. FIG. 10C shows ten reference footprints 1020 of an object 1010. The reference footprints 1020 can be scaled using a scale factor calculated based on a first scan. In various examples, scanning the object by hand can create certain uncertainties in the resulting mapping between the inductance and the corresponding location in the object's contact area. However, such uncertainties may not cause significant issues in object recognition and in sensing a sliding movement. Finally, data points between two adjacent samples in the reference footprint can be interpreted using any suitable interpretation methods, such as linearly.

The inductance footprint or the signal can be used to encode the length of the object's contact area by examining a span of the curve. For a small object (e.g., a barrel of a bottle cap), the contact area is smaller than a coil. The inductance footprint can be scaled to match the size (such as the outer dimension or the outer diameter) of the coil. While the length may not reflected by the span of the curve, the length can be reflected by the inductance value.

At S820, when the object is recognized as the one of the reference objects, the process 800 proceeds to S830. Otherwise, when the object does not match any one of the reference objects in the database or the object is not recognized as any one of the reference objects in the database, the process 800 proceeds to S899, and terminates.

At S830, an application that is associated with the one of the reference objects can be executed such as started or resumed. The application can be any application in an electronic device or wearable device (e.g., the smartwatch) that communicates with the sensing apparatus 100. In an example, the wearable device or the electronic device having the application can be integrated into the sensing apparatus 100. The application can be a video player, an aircraft game, a brick breaker game, an audio book app, a fitness app, a setting voice mode app, or the like as shown in FIGS. 11A-11F.

Different objects can generate different signals or inductance footprints in the sensing device 110, and thus can be associated with different applications. Similarly, different positions (e.g., touched by a same object) on the sensor 110 can be associated with different applications. An object can be instrumented differently, for example, by including different conductive markers, and thus can be associated with different applications. In some examples, the reference signals of a reference object can include signals generated by tapping the reference object at different positions on the sensor 110.

Figure 11A:
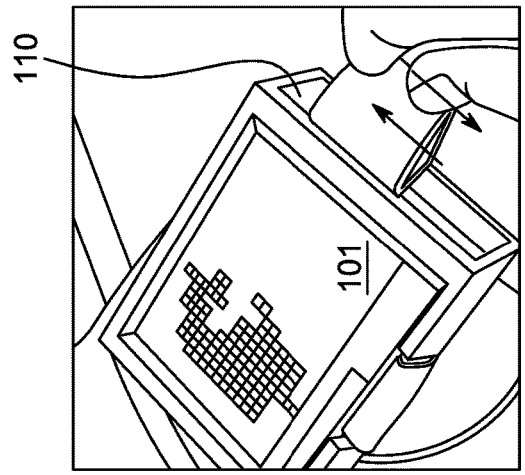
FIGS. 11A-11F show exemplary interactions between a sensing apparatus and objects according to an embodiment of the disclosure.

Referring to FIG. 11A, the application is the video player that shows Forward, Play/Pause, and Backward buttons on a location 1111 of the touchscreen or surface 101. Tapping a dime on the sensor 110 at a first location near the button can trigger or start the corresponding action, and thus avoiding a finger occluding the touchscreen 101 and false input from a hand accidentally touching the sensor 110. Alternatively, tapping another object, such as a fork, at the first location can trigger a different application. In an example, tapping the dime on the sensor 110 at a second location can also trigger or start a different application.

Figure 11C:
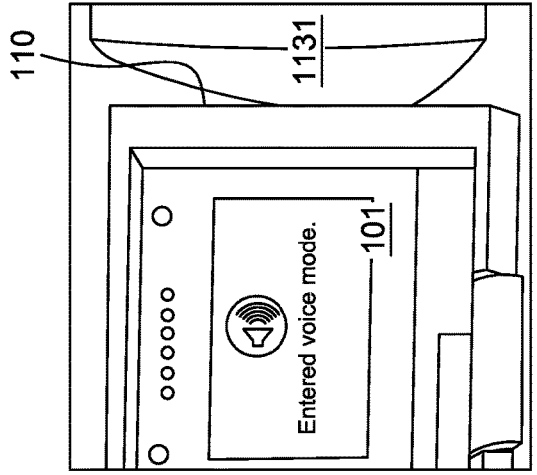
Figure 11B:
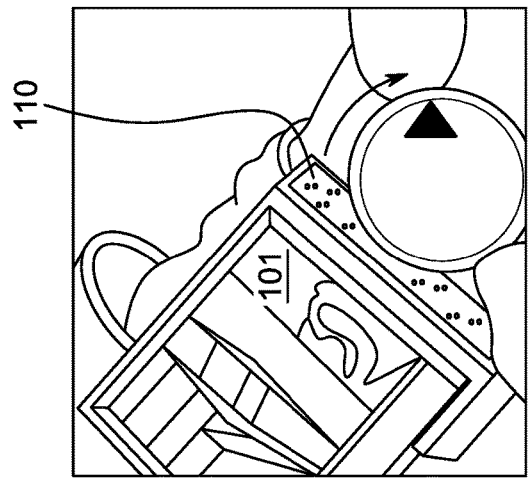
Figure 11E:
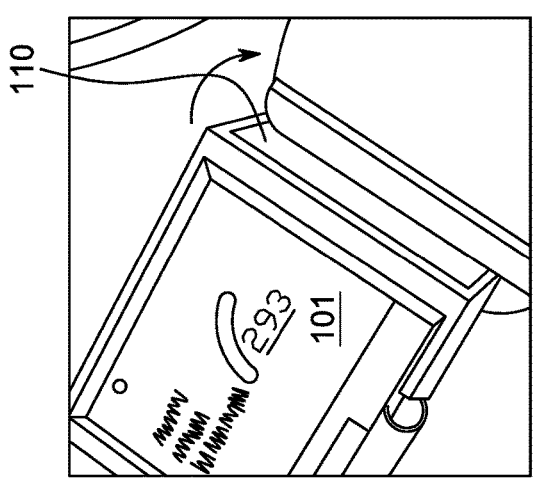
Figure 11D:
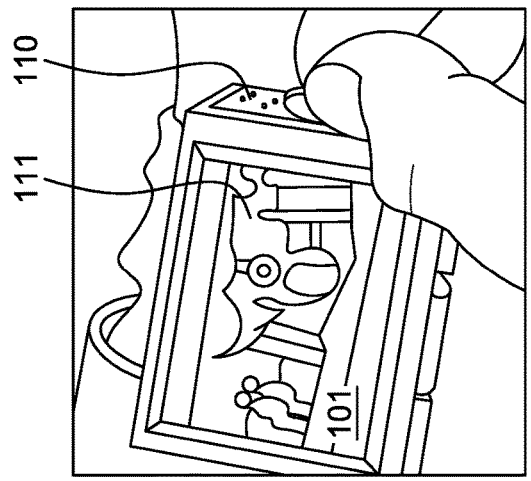

Referring to FIG. 11D, the application is an audio book app that associates a user's book(s) with audio copies stored on the smartwatch. In an example, the book(s) are instrumented using conductive marker(s). A user can tap a book 1121 on the smartwatch to play the audio or download the book if the book is not saved on the smartwatch, thus providing a method to navigate and search for the desired audio to play.

Figure 11F:
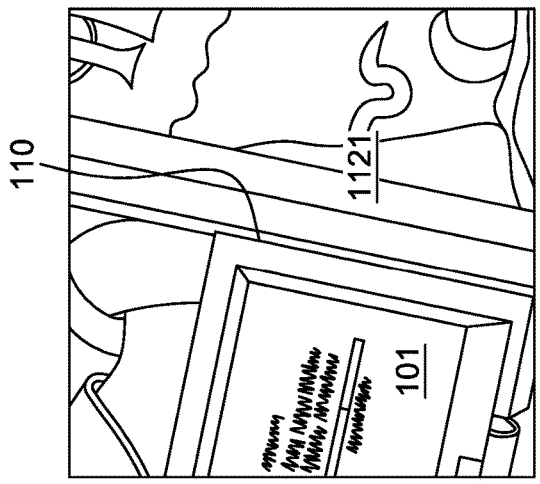

Referring to FIG. 11F, a user can use a pendant 1131 of a car key to quickly activate voice mode on the smartwatch before starting a vehicle, thus facilitating a quick switch between different modes on the smartwatch.

At S840, a movement of the object can be determined based on signals measured at S840 by the sensing apparatus 100.

Figures 12A, 12B:
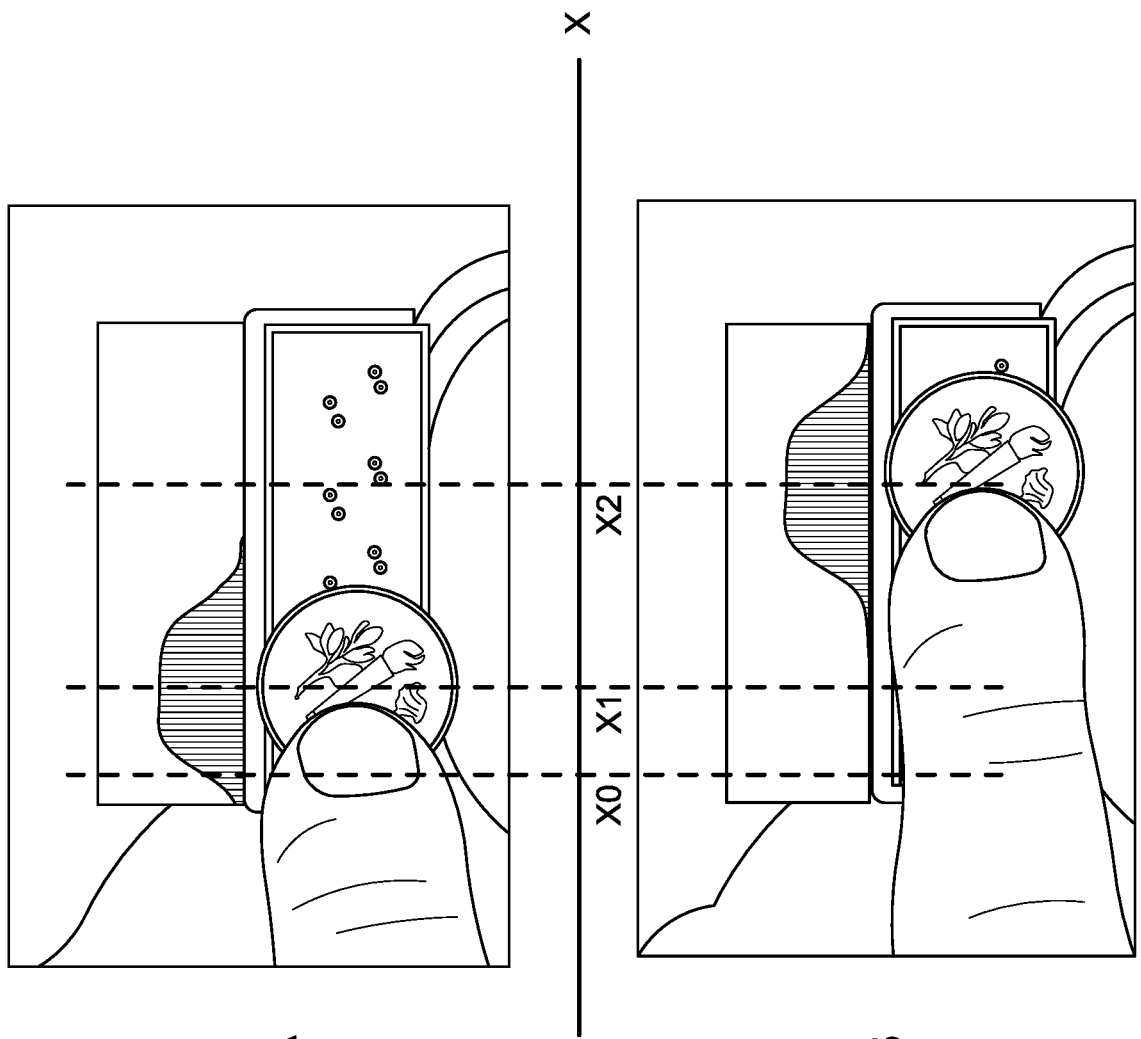
FIGS. 12A-12B show a sliding movement according to an embodiment of the disclosure.

After the object (e.g., a coin in FIGS. 12A-12B) is recognized as the one of the reference objects in S820, a sliding movement can be detected by sensing the shift of the position of the corresponding reference footprint over the sensors, as shown in FIG. 12A-12B. A center of the reference footprint of the object can be used to represent a location of the object when: (1) a size of the object is smaller than a size of the sensor 110 as shown in FIGS. 12A-12B or (2) the object is instrumented using a copper tape. When the size of the object is larger than the size of the sensor 110, the location of the object can be represented by an end (or an edge) of the object (e.g., the end of a handle of a table knife), and thus the sliding movement can be tracked by tracking a movement of the end of the object.

In an example, an end (e.g., a center of the coil at the end of the sensor 110) of the sensor 110 can be set to be an origin of the sensor's coordinate system (e.g., x=0). The end can be manually specified for each object by tapping the object or the edge of the object on the center of the coil at the end of the sensor 110. In an example, each reference object has ten corresponding reference footprints. For each of the ten reference footprints of the contacted object, the location x over the sensor can be obtained using:

$$\operatorname*{argmin}_{x}\left(\sum_{i=0}^{4}|f(x+d\times i)-y_i|\right)-x_0 \qquad (6)$$

where $x_0$ is the origin, such as 0. The prediction of the object's location is an average location of top five candidates ranked based on the similarity to the testing footprint (or the signal). The sensing apparatus 100 can support both absolute and relative input.

Referring to FIG. 12A, a location X1 can be obtained by applying Eq. (6) to a first signal (a testing footprint) measured at the location X1 and the ten reference footprints of the coin. Referring to FIG. 12B, a location X2 can be obtained by applying Eq. (6) a second signal measured at the location X2 and the ten reference footprints of the coin.

In general, the signals (or the sliding signals) measured when the object is sliding along an axis in the sensing surface 103 corresponding to linear positions (or locations) of the object along the X axis. The locations or positions of the object can be determined based on the plurality of reference signals and the sliding signals. In an example, for each of the sliding signals, the plurality of reference signals can be shifted by a plurality of offset distances and the plurality of shifted reference signals and the sliding signal can be matched to determine the linear position where the linear position corresponds to one of the plurality of offset distances.

A tilting movement or hinging can also be detected at S840. In an embodiment, the labelled references or the reference signals in the database can include reference tilting signals for the reference objects. In an example, the database includes a plurality of reference tilting signals for each of a subset of the reference objects.

The plurality of reference tilting signals for a reference object that is flat can be obtained by manually or automatically hinging open (or tilting) the reference object in a relatively constant speed, from a first angle, such as 0° (e.g., the object is parallel to the surface 103 of the sensing device 110 or the object stands perpendicular to the wrist) to a second angle, such as 60°. The second angle can be set as 60° as the object can lie outside the sensing range of the sensing apparatus 100 when the tilt angle is larger than 60°. The collected data can contain five inductance values, one from each of the coils 171-175 and a corresponding time stamp. The collected data can be converted from the time domain to the hinging angle domain by using two reference hinging angles (e.g., 10° and 45°) measured, for example, manually using a protractor or by using any suitable method. For each reference object, multipole (such as 10) reference tilting signals can be collected and stored in the database.

At S840, the inductance values from the coils 171-175 can be used against the plurality of reference tilting signals (or labelled data) for the one of the reference objects identified with the object at S820 with a local optimized prediction described in Eq. (7):

$$\operatorname*{argmin}_{x}\sum_{i=0}^{4}|f_i(x)-y_i| \qquad (7)$$

where x is the hinging angle (or tilting angle), fi is the reference mapping collected from coil i, and yi is the observed inductance value at coil i. The prediction can be the average angle of top five candidates ranked based on similarity.

Similar to a sliding movement, a hinging movement can be detected with an environmental conductive object and an artificial conductive object. In various examples, the object may be flat to provide a relatively stable hinging axis. In an example, the location of the object inside the sensor 110 is known, thus different actions can be triggered by hinging at different locations. In an embodiment, the reference tilting data or the reference tilting signals for the reference objects are independent of where the reference objects are when the data are collected, because the reference tilting data can be shifted along the x axis of the sensor 110.

A sliding movement and a hinging movement can be uniquely identified or differentiated via examining characteristics of the signals. For example, with a hinging movement, changes in the signal from different coils are similar (e.g. all increase) while signal from different coils changes sequentially with a sliding movement.

Figures 13A, 13B, 13C:
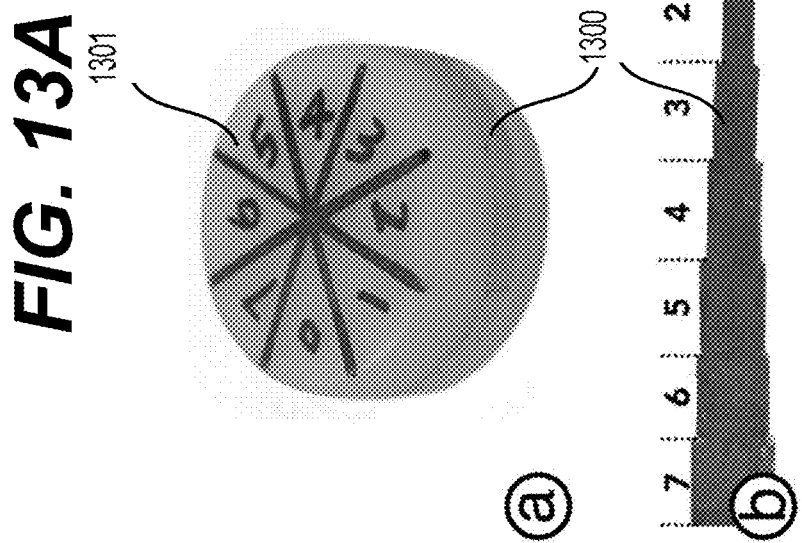
FIGS. 13A-13B show rotation of an object according to an embodiment of the disclosure.
FIG. 13C shows an exemplary object confusion matrix according to an embodiment of the disclosure.

In an embodiment, artificial conductive objects are used to detect rotation. To enable rotation detection, a strip of copper tape can be placed along a barrel of a bottle cap. A width of the copper tape can gradually increase to allow the sensor 110 to pick up the bottle cap's orientation based on the strength of the inductance signal. Alternatively, a copper tape 1300 including multiple (e.g., 8) sections having different heights can be used, as shown in FIG. 13B. Each section is 12 mm wide with a 1 mm increment in height, resulting in a staircase pattern. The copper tape 1300 is attached to the bottle cap 1301, resulting in discrete levels (or wedges) of rotational directions. Thus, each wedge on the bottle cap can be treated as an "object" that corresponds to one of the reference objects in the database. Thus, detecting the rotation is to detect the multiple "objects" 0-7 using, for example, the KNN. Of course, an environmental conductive object can also be used to detect rotation, for example, when the environmental conductive object can result in changes in the signals when being rotated against the sensor 110.

Figure 9C:
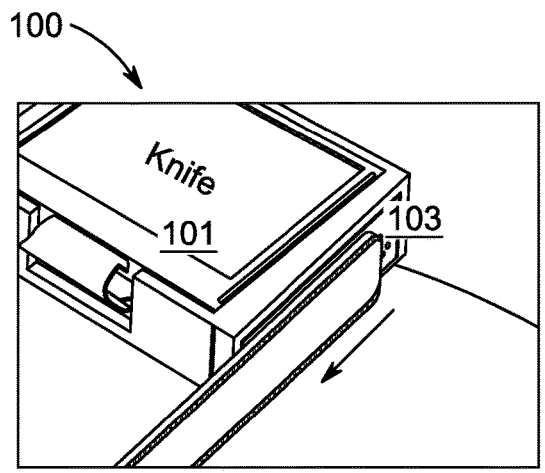
Figure 9D:
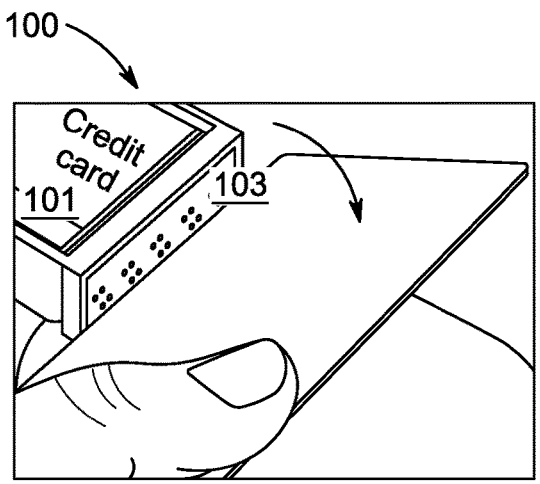
Figure 9E:
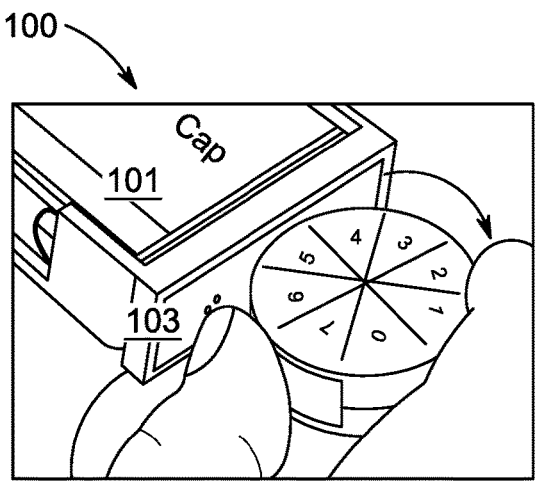

Referring to FIG. 9C, a knife slides along the X axis against the sensing surface 103, the sliding movement can be determined, as described above. Referring to FIG. 9D, a credit card tilts away from the sensing surface 103, and the tilting movement can be determined as described above. Referring to FIG. 9E, a bottle cap instrumented using a copper tape rotates around the Z axis against the sensing surface 103, and the rotation can be determined as described above.

At S850, the application can be controlled based on the movement determined at S840. Referring to FIG. 11B, the application is a top-down aircraft game. The instrumented bottle cap (e.g., the bottle cap 1301 including the copper tape 1300) can be used to launch the application at S820 and subsequently to steer an aircraft as a rotating controller. Thus, the touchscreen space is not occluded by a controller on the interface or a user's finger.

Referring to FIG. 11C, the application is a brick breaker game. The brick breaker game can be difficult to play on the smartwatch when a finger occludes the touchscreen space when dragging a paddle. FIG. 11C shows that the paddle can be precisely positioned by sliding a binder clip along the sensor 110, and thus the binder clip functions as a physical handle.

Referring to FIG. 11E, the application is a fitness app which encourages a user to enter calorie information during a meal. The user can enter an estimated calorie value by hinging a handle of a table knife to avoid touching the touchscreen when using a finger that is messy from eating their meal.

The process 800 then proceeds to S899 and terminates. In general, the process 800 can be suitably adapted according to various scenarios and applications. One or more steps may be omitted; additional step(s) can be included; and a sequence of the process 800 can be adapted. In an example, a step can be added where the reference signals, reference tilting signals, and/or the like, of the reference objects are obtained using the sensing apparatus 100. For example, S840 may be implemented in two steps. A first step determines whether the object is moving; and a second step determines the movement when the object is determined to be moving. In an example, S840 may include a step to determine a type of the movement, such as sliding, tilting, or rotation before extracting detailed information of the movement, for example, using Eqs. (6) and (7).

Two studies including Study 1 and Study 2 were performed to evaluate the sensing apparatus 100.

Study 1: an object recognition accuracy of the sensing apparatus 100 can be evaluated, for example, to understand robustness across various locations as well as against individual variance among different users. Ten right-handed participants (average age: 22.6, two female) participated in a study. A prototype apparatus implementing the sensing apparatus 100 is made. Participants wore the prototype apparatus on the left hand. The 23 objects A-W shown in FIGS. 6A-6D are tested in the study.

One week prior to the study, reference signals of the objects A-W were collected with the prototype worn on the left hand by a volunteer and the apparatus powered by a wall outlet (earth ground). Which part of the objects to scan and how to scan in a relatively constant speed were demonstrated to the volunteer. No other instructions or training were given. Ten reference signals were sampled for each object and the volunteer was not recruited again in a final study. A bottle cap was trained and tested using wedge 3, randomly picked from the eight options 0-7 of FIG. 13B.

Prior to the start of the study, participants were briefly shown how to use each object. For example, the object's contact area is to be exposed to the sensor as much as possible. No practice trial was given. The study protocol includes: participants conducted a live object recognition study with the 23 objects in five living environments, including 1) a living room, 2) a kitchen, 3) a computer desk with a laptop and monitor, 4) a parking space outside a building, and 5) inside a running car with the radio, heater, and Bluetooth all switched on. The device was powered by a wall outlet when indoor and a battery (floating ground) when outside the building or in a car. The locations were randomized between participants. Within each location, objects were presented in a random order, appearing five times each in total. Real-time prediction results were recorded.

Figure 14:
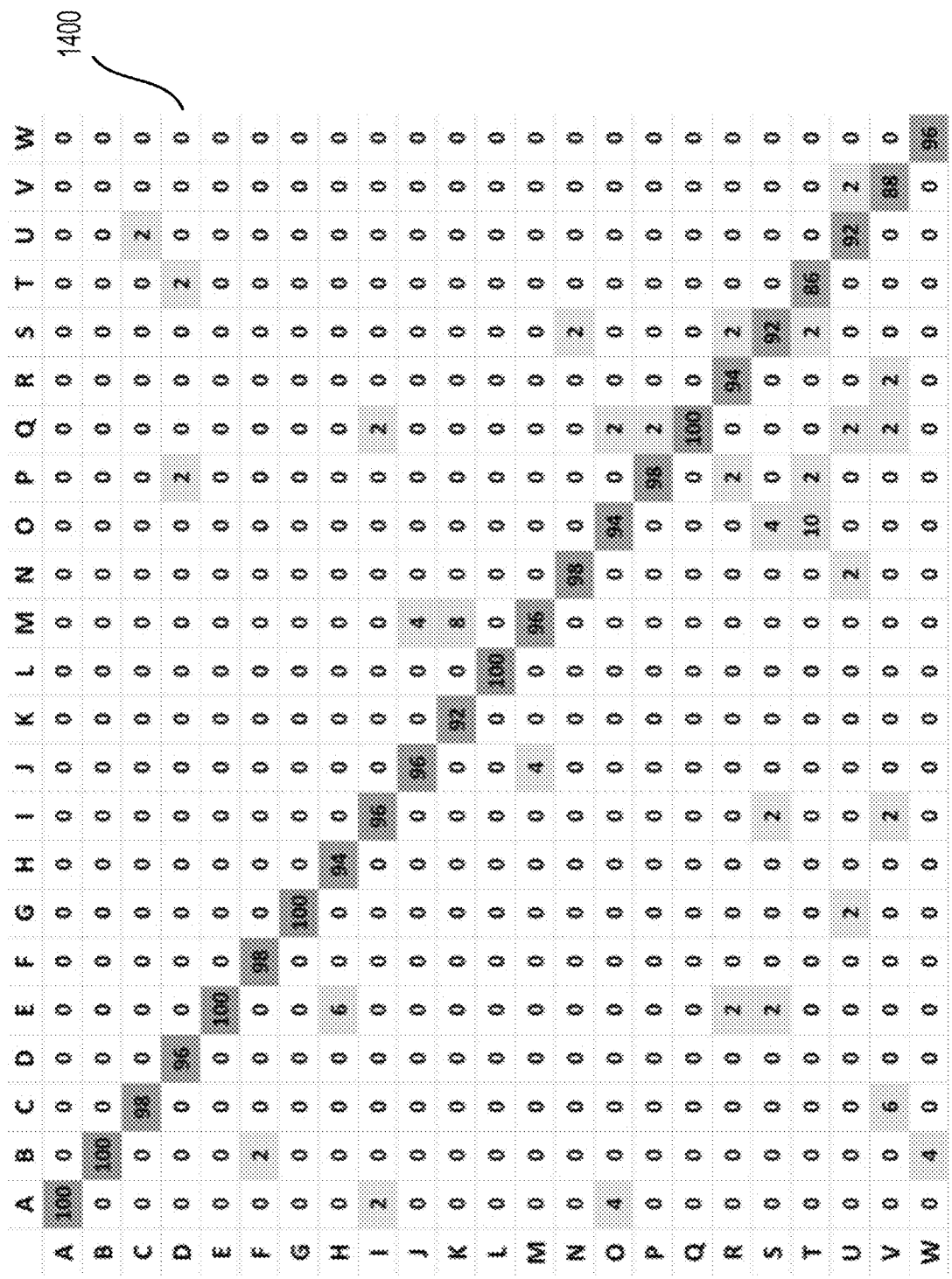
FIG. 14 shows an exemplary object confusion matrix according to an embodiment of the disclosure.

FIG. 14 shows an object confusion matrix 1400 across the 23 objects and 10 participants according to an embodiment of the disclosure. Results are shown in percentage. In general, the prototype apparatus implementing the sensing apparatus 100 achieved an overall object recognition accuracy of 95.8% (s.e.=0.81%). Among the tested 23 objects, 21 objects achieved an accuracy higher than 90%, despite purposeful inclusion of experimental procedures that typically impact recognition accuracy, such as no per-user calibration, no user training, and considerable time separation between the experiment and when the reference data was collected. Thus, the results are promising. Power source (e.g., earth vs floating ground) has a negligible effect on object recognition. The confusion matrix 1400 shows that the Kindle paperwhite (K) was sometimes misclassified as iPhone 6Plus Front (M), for example, because both objects (K and M) have a similar structure with built-in electronic components.

Figures 15A, 15B:
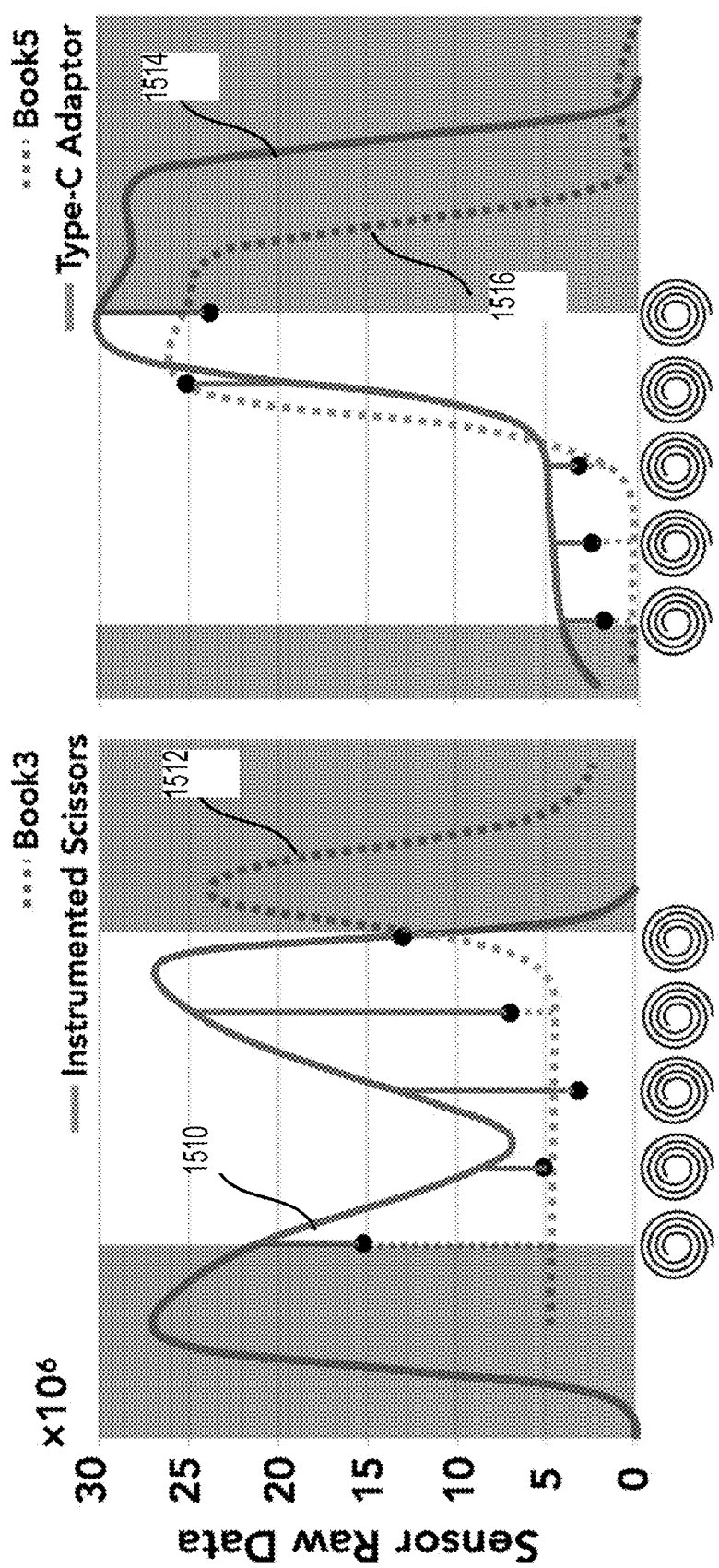
FIGS. 15A-15B show exemplary reference signals according to an embodiment of the disclosure.

The instrumented non-conductive objects can be differentiated from each other. In an example, the instrumented non-conductive objects can be separated via the instrumented conductive patterns. Book 3 (T) and Book 5 (V) achieved the lowest accuracy among all the 23 objects, with 86% (s.e.=4.96%) and 88% (s.e.=4.64%) accuracy, respectively. Book 3 can be confused with the Instrumented Scissors (O). As shown in FIG. 15A, the testing footprint or the signal associated with the object (dots) can have shorter distance to the reference footprint 1510 of Instrumented Scissors than that 1512 of the Book 3, for example, when the book 3 was held with a smaller hinging angle to the sensor, causing the signals to be weak. The types of errors can be mitigated by introducing more weight to the shape of the curve than the distance. Book 5 (V) was occasionally misclassified as a Type-C Adaptor (C). As shown in FIG. 15B, this is primarily due to the similarity between the reference footprints 1514 (Type-C adaptor) and 1512 (book 5). This type of error can be solved by using more distinguishable pattern designs.

When a frequency of the background EMI is close to a resonant frequency of a sensing apparatus, performance of the sensing apparatus can be affected. In an example, the resonant frequency of the prototype apparatus is from 4.63 to 4.94 MHz that is uncommon in daily environments. To investigate the robustness of the prototype apparatus under common environmental noises, the study was performed with the same 23 objects in locations that were within 10 cm of a running microwave, a WIFI router, and a 3D printer that are common sources of strong electromagnetic noises. With each device, the objects were presented in a random order, and each of the objects appeared three times. The study was carried out with a single participant (male, right-handed, 25 years old). The results showed a real-time recognition accuracy of 100%. Further, the raw data show that no significant effect was caused by the tested electromagnetic noises. Accordingly, the prototype apparatus or the sensing apparatus 100 described in the disclosure is not or minimally affected by common environmental noises.

Study 2 of 1D object manipulation: the study 2 is to measure how accurate the prototype apparatus can sense sliding, hinging, and rotation movements. Reference data was collected by the same initial volunteer from the study 1, also one week prior to the study 2. The study 2 was carried out by a single participant (male, right-handed, 21 years old) sitting at a computer desk.

Figure 16A:
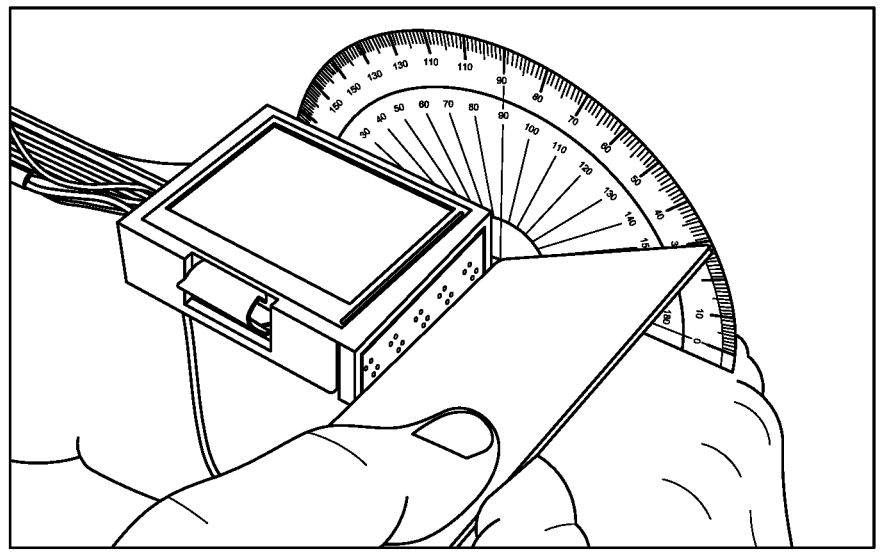
FIGS. 16A-16B show exemplary configurations for tilting and sliding movements according to an embodiment of the disclosure.
Figure 16B:
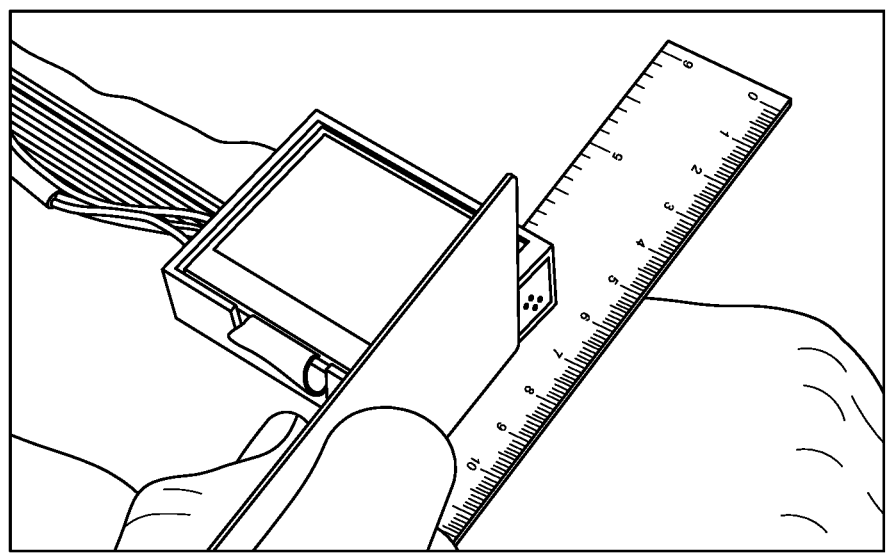

To measure the sliding accuracy, one object was randomly picked from each category, including Dime, Credit Card, Instrumented Knife Handle, and Book 3. Bottle Cap was included to investigate the effect of a smaller contact area on a tracking accuracy. In Study 2, the participant wore the prototype apparatus on the wrists of the left hands, and slided each of the objects against the sensor three times. The sliding movement or action was to be completed from one end (e.g., origin) of the sensor to the other, with an approximate sliding distance of 40 mm. The participant stopped every 2 mm, and the experimenter recorded the ground truth, measured using a ruler mounted against the sensor, as shown in FIG. 16B. A computer recorded the predicted distance from the origin. The sliding accuracy is measured using average error distance $ED_{avg}$ that is defined as $$\frac{1}{n}\sum_{i=1}^{n}|\hat{y}_i - y_i|,$$

where $\hat{y}_i$ is a predicted location, $y_i$ is ground truth, and n is the number of trials (e.g., 21 locations×3 repetitions).

The results show that $ED_{avg}$ across all tested objects was less than 1 mm (e.g., 0.82 mm; s.e.=0.17 mm). Specifically, the average error distance for Dime, Credit Card, Instrumented Knife Handle, Book 3 and Bottle Cap are 0.45 mm (s.e.=0.02 mm), 1.38 mm (s.e.=0.11 mm), 0.65 mm (s.e.=0.15 mm), 1.17 mm (s.e.=0.07 mm), and 0.47 mm (s.e.=0.07 mm), respectively. Contact size does not affect the sliding accuracy, as the Bottle Cap received one of the highest accuracies amongst all the tested objects. Book 3 received a relatively low accuracy score. This may be due to the imprecision of tracking the valley of the conductive marker. The accuracy for Credit Card was lower than the other tested objects. This may be due to material of Credit Card.

To measure the hinging accuracy, thin and flat objects including Credit Card, Table Knife, and Instrumented Table Knife were selected. Dime was excluded due to a size of Dime. The Keychain Pendant was excluded due to the uneven contour. Participants hinged open a tested object from 0° to 60° three times and stopped every 4° to allow the experimenter to record the ground truth using a protractor mounted on the prototype, as shown in FIG. 16A. The predicted hinging angle was also recorded using a computer. The hinging accuracy is measured using average error distance $ED_{avg}$ defined as $$\frac{1}{n}\sum_{i=1}^{n}|\hat{d}_i - d_i|,$$

where $\hat{d}_i$ is the predicted hinge degree, $\hat{d}_i$ is the ground truth, and n is the number of trials (e.g., 16 discrete angles×3 repetitions).

Figure 17:
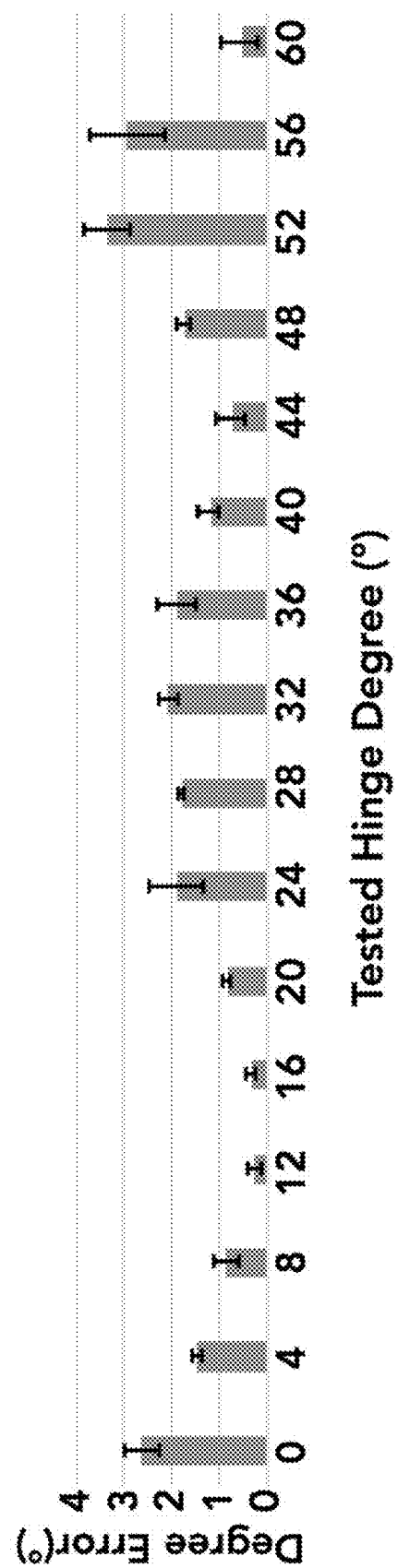
FIG. 17 shows an exemplary error analysis according to an embodiment of the disclosure.

$ED_{avg}$ across all three tested objects was 1.64° (s.e.=0.37°). Specifically, the average error distance for Credit Card, Knife Handle, and Instrumented Knife Handle were 1.53° (s.e.=0.13°), 2.48° (s.e.=0.19°), and 0.92° (s.e.=0.2°), respectively. Instrumented Knife Handle had the highest accuracy, with its average error distance remaining less than 3°, even up to 80°. Most errors came from the angles away from the ones marked manually, when converting the reference data from the time domain to the hinging angle domain (e.g., 10° and) 45°. FIG. 17 shows an example from Credit Card. While the accuracy may increase with the increasing number of manually-marked angles, the result is promising with the least amount of training efforts from a user. The results indicate that hinging accuracy can differ among different objects.

Rotation was tested with participant rotating the Bottle Cap 1301 (FIGS. 13A-13B) three times at any location inside the sensor. Participant stopped every 9°, and the apparatus recorded the predicted wedge. The average classification accuracy of the eight wedges was 93% (s.e.=4.37%). A confusion matrix 1310 in FIG. 13C shows that most classification errors occurred around the borders of the wedges. Wedge 7 was confused with Wedge 2 for 20% of the time. This may be because when the samples were picked from a location closed to the Wedge 1 border, the inductance value got evened to a level similar to that of Wedge 2. Similarly, 20% confusion was found between Wedge 7 and Wedge 6 at the border.

While this disclosure has described several exemplary embodiments, there are alterations, permutations, and various substitute equivalents, which fall within the scope of the disclosure. It will thus be appreciated that those skilled in the art will be able to devise numerous apparatuses and methods which, although not explicitly shown or described herein, embody the principles of the disclosure and are thus within the spirit and scope thereof.

The invention claimed is:

1. A sensing apparatus, comprising:
a sensing device including resonators having respective resonant frequencies, the resonators including an array of a plurality of inductive coils positioned on a surface of the sensing apparatus, wherein the sensing device is configured to output signals indicating changes of the resonant frequencies of the inductive coils caused by presence of an object proximate to the surface of the sensing apparatus;
a memory storing, for each reference object of a plurality of reference objects, an identity of the each reference object in association with predetermined reference signals corresponding to the each reference object, the predetermined reference signals indicating changes of the resonant frequencies of each inductive coil in the array of inductive coils caused by presence of the reference object proximate to the surface of the sensing apparatus; and
processing circuitry configured to
receive, from the sensing device, particular signals caused by presence of a particular object proximate to the surface of the sensing apparatus, the particular signals indicating changes of the resonant frequencies of each inductive coil in the array of inductive coils caused by the presence of the particular object; and
compare the particular signals with the stored predetermined reference signals of the plurality of reference objects to determine an identity of the particular object among the plurality of reference objects whose identity is stored in the memory.

2. The sensing apparatus of claim 1, wherein
the surface of the sensing apparatus is a substantially planar surface; and
the particular object is in contact with the surface of the sensing apparatus when the particular signals are received by the processing circuitry.

3. The sensing apparatus of claim 2, wherein the array of inductive coils is a linear array in which the inductive coils are arranged in a straight line.

4. The sensing apparatus of claim 1, wherein each inductive coil of the array of inductive coils is a planar spiral coil having a circular shape.

5. The sensing apparatus of claim 3, wherein a number of the inductive coils in the array of inductive coils is five.

6. The sensing apparatus of claim 5, wherein each inductive coil in the array of inductive coils is a circular coil that has multiple layers and multiple turns.

7. The sensing apparatus of claim 2, wherein the processing circuitry is further configured to determine, based on the received particular signals, a length of the particular object that is in contact with the surface.

8. The sensing apparatus of claim 1, wherein the processing circuitry is further configured to compare the particular signals with each of the reference signals of the reference objects using k-nearest neighbors algorithm.

9. The sensing apparatus of claim 2, wherein after the particular object is identified, the processing circuitry is further configured to:
receive sliding signals when the particular object is sliding along an axis in the planar surface, the sliding signals corresponding to linear positions of the particular object along the axis; and
determine the linear positions based on the predetermined reference signals and the received sliding signals.

10. The sensing apparatus of claim 9, wherein
each of the sliding signals corresponds to a respective one of the linear positions; and
for each sliding signal of the sliding signals, the processing circuitry is further configured to:
shift the predetermined reference signals by a plurality of offset distances; and
match the shifted reference signals and the sliding signal to determine the linear position, the linear position corresponding to one of the plurality of offset distances.

11. The sensing apparatus of claim 9, wherein each of the linear positions corresponds to a position of an edge of the particular object.

12. The sensing apparatus of claim 9, wherein each of the linear positions determined by the processing circuitry corresponds to a center position of one of the predetermined signals.

13. The sensing apparatus of claim 2, wherein
the reference signals further include a plurality of reference tilting signals for each of the reference objects; and
after the particular object is identified, the processing circuitry is further configured to:
receive tilting signals when one surface of the particular object is tilted around an axis in the planar surface, the tilting signals corresponding to tilting angles formed by the surface of the particular object and the planar surface; and
determine the tilting angles based on the plurality of reference tilting signals and the received tilting signals.

14. The sensing apparatus of claim 2, wherein
the particular object has a cylindrical surface with an axis of rotation and includes a metallic tape covering a portion of the cylindrical surface; and
after the particular object is identified, the processing circuitry is further configured to:
receive rotation signals when the particular object is rotated around the axis of rotation, the rotation signals corresponding to rotation angles; and
determine the rotation angles based on the stored predetermined reference signals of the reference objects and the received rotation signals.

15. The sensing apparatus of claim 1, wherein the memory stores the identity of at least three reference objects in association with the predetermined reference signals corresponding to each of the at least three reference objects, wherein the stored reference signals corresponding to each of the at least three reference objects include a plurality of values corresponding to each of the inductive coils in the array.

16. A sensing method of a sensing device including resonators having respective resonant frequencies, the resonators including an array of a plurality of inductive coils positioned on a surface of an apparatus, wherein the sensing device is configured to output signals indicating changes of the resonant frequencies of the inductive coils caused by presence of an object proximate to the surface of the apparatus, the sensing method comprising:
storing, in a memory for each reference object of a plurality of reference objects, an identity of the each reference object in association with predetermined reference signals corresponding to the each reference object, the predetermined reference signals indicating changes of the resonant frequencies of each inductive coil in the array of inductive coils caused by presence of the reference object proximate to the surface of the apparatus;
receiving, from the sensing device, particular signals caused by presence of a particular object proximate to the surface of the apparatus, the particular signals indicating changes of the resonant frequencies of each inductive coil in the array of inductive coils caused by the presence of the particular object; and
comparing the particular signals with the stored predetermined reference signals of the plurality of reference objects to determine an identity of the particular object among the plurality of reference objects whose identity is stored in the memory.

17. The sensing method of claim 16, further comprising executing a particular application associated with the determined identity of the particular object, when determining the identity of the particular object.

18. The sensing method of claim 16, wherein
the surface is a substantially planar surface, the particular object is in contact with the surface; and
the sensing method further comprises, after identifying the particular object,
receiving sliding signals when the particular object is sliding along an axis in the planar surface, the sliding signals corresponding to linear positions of the particular object along the axis; and
determining the linear positions based on the plurality of signals and the received sliding signals.

19. The sensing method of claim 16, wherein
the surface is a substantially planar surface, the particular object is in contact with the surface, and the reference signals further include a plurality of reference tilting signals for each of the reference objects; and
the sensing method further comprises, after identifying the particular object,
receiving tilting signals when one surface of the particular object is tilted around an axis in the planar surface, the tilting signals corresponding to tilting angles formed by the surface of the particular object and the planar surface; and
determining the tilting angles based on the plurality of reference tilting signals and the tilting signals.

20. The sensing method of claim 16, wherein
the surface is a substantially planar surface, the particular object is in contact with the surface;
the particular object has a cylindrical surface with an axis of rotation and includes a metallic tape covering a portion of the cylindrical surface; and
the sensing method further comprises, after identifying the particular object,
receiving rotation signals when the particular object is rotated around the axis of rotation, the rotation signals corresponding to rotation angles; and determining the rotation angles based on the stored predetermined reference signals of the reference objects and the rotation signals.

\* \* \* \* \*